US007338911B2

(12) United States Patent
Kido

(10) Patent No.: US 7,338,911 B2
(45) Date of Patent: Mar. 4, 2008

(54) METHOD FOR ETCHING AND FOR FORMING A CONTACT HOLE USING THEREOF

(75) Inventor: Shusaku Kido, Izumi (JP)

(73) Assignee: NEC LCD Technologies, Ltd., Kanagawa (JP)

(*) Notice: Subject to any disclaimer, the term of this patent is extended or adjusted under 35 U.S.C. 154(b) by 85 days.

(21) Appl. No.: 11/318,519

(22) Filed: Dec. 28, 2005

(65) Prior Publication Data

US 2006/0141789 A1   Jun. 29, 2006

(30) Foreign Application Priority Data

Dec. 28, 2004   (JP) .............................. 2004-381684

(51) Int. Cl.
*H01L 21/302* (2006.01)
(52) U.S. Cl. ...................... 438/745; 438/750; 438/760
(58) Field of Classification Search ................ 438/745, 438/750, 752, 760; 430/311, 312
See application file for complete search history.

(56) References Cited

U.S. PATENT DOCUMENTS

2003/0186170 A1*   10/2003   Yamashita .................. 430/311

FOREIGN PATENT DOCUMENTS

| JP | 10268353 | 10/1998 |
|---|---|---|
| JP | 2000-164584 | 6/2000 |

* cited by examiner

*Primary Examiner*—Lan Vinh
(74) *Attorney, Agent, or Firm*—Young & Thompson

(57) ABSTRACT

A method for forming a structure formed by etching which is typified by a contact hole in the semiconductor and a method for manufacturing a display device using the structure. The etching method includes at least, forming an organic mask having a first opening portion and a second opening portion by patterning an organic film which includes either one of an organic film and a film with the addition of organic solvent and is located on a constituent part to be etched, and forming a transformed organic mask by dissolving the organic mask in contact with organic solvent and reflowing.

52 Claims, 10 Drawing Sheets

Tapered J

Solvent Vapor

METHOD FOR ETCHING AND FOR FORMING A CONTACT HOLE USING THEREOF

FIELD OF THE INVENTION

The present invention relates to a method for forming a structure formed by etching which is typified by a contact hole in the semiconductor such as a thin film transistor and to a method for manufacturing a display device using the structure, and more specifically relates to the method for the structure formed by etching which is typified by the contact hole formed using the technology of reflow in dissolving and to the method for manufacturing a thin film transistor substrate for the display device using the structure. Here, "an etching structure" is defined as "a structure formed by etching process", and also the structure formed by etching process, which is typified by the contact hole is defined as "etching structure".

BACKGROUND OF THE INVENTION

For the purpose of fully explaining about the level of technology at present with regard to the present application, it should be noted that all explanation in the documents such as patents, patent applications, patent publications and science papers cited or specified in the present application is incorporated into the present application by referring them.

The high integration of the semiconductor device has been achieved through the lithography technology for forming a minute pattern and the etching technology. However, as thus high performance of the semiconductor device progresses, it follows that the manufacturing cost increases because of sophisticated manufacturing processes.

So, recently it is desired to drastically reduce manufacturing cost of the semiconductor device and to shorten the whole number of processes through integrating the process for manufacturing the contact hole patterns by conducting (1) to form a minute contact hole, as a first challenge, (2) to create a contact hole with forward tapered, as a second challenge and (3) to form a plurality of contact holes with different depth or aspect ratio in one time process of lithography, as a third challenge.

In realizing to form the minute contact hole as the first challenge mentioned above it is already known that a transformed resist can be formed through the process that causes thermal reflow in an organic film by further heat treatment after patterning by means of exposing a resist made of the organic film and processing procedure to it.

And then it is possible to form the contact hole with minute dimensions which exceeds exposure limit, by etching using this transformed resist This first prior art will be explained referring to the drawings. FIGS. 1A to 1D are partial longitudinal sectional views illustrating a series of processes for forming minute contact holes that utilizes thermal reflow of a resist film made of an organic film with regard to the first prior art As illustrated in FIG. 1A, a gate electrode 102 is selectively formed on a substrate 101. Then, a first interlayer insulating film 103 is formed on the substrate 101 and the gate electrode 102. Further, a resist mask 106 is formed on the first interlayer insulating film 103 through a process of coating a resist film made of an organic film on the first interlayer insulating film 103 and exposing the resist film and then processing procedure to it. In the case, the limit of the dimension D1 in the opening portion of the resist mask 106 depends on the limit of exposure.

As illustrated in FIG. 1B, to reduce the dimension D1 in the opening portion of the resist mask 106 to the extent smaller than the limit of exposure, thermal reflow in the resist mask 106 is caused through heat treatment to whole the substrate 101 at a temperature in the range of 150° C. to 200° C., thereby the dimension D1 in the opening portion of the resist mask 106 diminishes in size to the dimension D2, where the dimension D2 is smaller than the dimension D1. As the result a resist mask 107 is formed, which is transformed through thermal reflow and is provided with the opening portion with the minute dimension D2 exceeding the limit of exposure.

As illustrated in FIG. 1C, a contact hole 108 reaching the gate electrode 102 is formed through etching the first interlayer insulating film 103 using the resist mask 107 with the opening portion of the dimension D2, transformed by thermal reflow. Since the dimension of this contact hole 108 depends on the dimension D2 in the opening portion of the thermal reflow resist mask 107, it is possible to form the contact hole with much more minute dimension, compared with a contact hole not treated with thermal reflow of a resist mask.

As illustrated in FIG. 1D, a substrate is formed by removing the thermal reflow resist mask 107 using the known method, which is provided with the contact hole 108 defined by the minute dimension D2 exceeding the limit of exposure. Then, using the known manufacturing method, the substrate is formed to a target product of the semiconductor device.

In the next, the prior art with regard to a contact hole with forward tapered, as the second challenge, will be explained.

A contact hole with a little forward tapered is formed by etching using the resist mask formed by the known lithography method without change.

This second prior art will be explained referring to the drawings.

FIGS. 2A to 2C are partial longitudinal sectional views illustrating a series of processes for forming contact holes, using the resist mask formed by the known process of lithography with regard to the second prior art without change.

As illustrated in FIG. 2A, a gate electrode 202 is selectively formed on a substrate 201. Then, a first interlayer insulating film 203 is formed on the substrate 201 and the gate electrode 202. Further, a second interlayer insulating film 204 is formed on the first interlayer insulating film 203. Thereafter, a resist mask 206 is formed on the second interlayer insulating film 204 through coating a resist film made of an organic film on the second interlayer insulating film 204, and conducting the exposing procedure of the resist film and then the processing procedure to it which are the known lithography process, wherein the opening portion of the resist mask 206 is a little forward tapered. Namely, the dimension of the opening portion in the horizontal direction decreases a little as the depth increases.

As illustrated in FIG. 2B, the second interlayer insulating film 204 is etched using the resist mask 206. In this case the resist mask 206 becomes a resist mask 207 with the surface removed a little, through removing the surface of the resist mask 206 a little and retracting the side wall facing to the opening portion of the resist mask 206. The dotted line in FIG. 2B shows a longitudinal cross sectional shape of the resist mask 206 before it is etched. At this time the hole formed in the second interlayer insulating film 204 is slightly forward tapered. Namely, the dimension in horizontal direction of the opening portion decreases a little as the depth increases.

As illustrated in FIG. 2C, a contact hole reaching the gate electrode 202 is formed through etching the first interlayer insulating film 203 using the resist mask 207 which surface is a little removed. In this case the resist mask 207 becomes a resist mask 208 with the surface further removed, through further removing the surface of the resist mask 207 and further retracting the side wall facing to the opening portion of the resist mask 207. The dotted line in FIG. 2C shows a longitudinal cross sectional shape of the resist mask 207 before it is etched.

It is apparent that the surface of the resist mask 208 illustrated in FIG. 2C shows the surface of the resist mask 207 illustrated in FIG. 2B further removed and also the side wall illustrated in FIG. 2B further retracted. At this time, a contact hole 209 formed in the first interlayer insulating film 203 and the second interlayer insulating film 204 is slightly forward tapered.

Through tapering forward slightly, the dimension of the contact hole 209 at the bottom diminishes slightly in size compared with the dimension at the upper part.

Then, a substrate is formed by removing the resist mask 208 using the known method, which is provided with the contact hole 209 slightly forward tapered. Then, using the known manufacturing method, the substrate is formed to a target product of the semiconductor device.

In the third, the prior art with regard to forming a plurality of contact holes with different depth or aspect ratio in one time process of lithography, as a third challenge, will be explained.

The third prior art will be explained referring to the drawings.

FIGS. 3A to 3D are partial longitudinal sectional views illustrating a series of processes for forming a plurality of contact holes with different depth in one time process of lithography with regard to the third prior art.

As illustrated in FIG. 3A, a first electrode 302 is selectively formed on a substrate 301. Then, a first interlayer insulating film 303 is formed on the substrate 301 and the first electrode 302. Then, a second electrode 305 is selectively formed on the first interlayer insulating film 303. As shown in the figure, here, the location of the second electrode 305 in the horizontal direction differs from that of the first electrode 302. Further, a second interlayer insulating film 304 is formed on the first interlayer insulating film 303 and the second electrode 305.

Thereafter, a resist mask 306 is formed on the second interlayer insulating film 304 through coating a resist film made of an organic film on the second interlayer insulating film 304, and conducting the exposing procedure of the resist film and then the processing procedure to it, which are the known lithography process, wherein the resist mask 306 is provided with a first opening portion 306-1 and a second opening portion 306-2. The first opening portion 306-1 is located in the upper side C2 of the first electrode 302, and the second opening portion 306-2 is located in the upper side C1 of the second electrode 305. As shown in the figure, the dimension D1 in the horizontal direction of the first opening portion 306-1 is larger than the dimension D2 in the horizontal direction of the second opening portion 306-2.

As illustrated in FIG. 3B, a first contact hole 307 and a second contact hole 308 are formed through etching the second interlayer insulating film 304 and the first interlayer insulating film 303 using the resist mask 306.

As shown in the figure, the first contact hole 307 is formed to be consistent with the first opening portion 306-1 of the resist mask 306, and reaches the surface of the first electrode 302 passing through the second interlayer insulating film 304 and the first interlayer insulating film 303.

And, the depth d1 of the first contact hole 307 corresponds to the value obtained by subtracting the thickness of the first electrode 302 from the sum of each thickness of the first interlayer insulating film 303 and the second interlayer insulating film 304. Further, the dimension of the first contact hole 307 in the horizontal direction is defined by the dimension D1 in the horizontal direction of the first opening portion in the resist mask 306.

On the other hand, the second contact hole 308 is formed to be consistent with the second opening portion 306-2 of the resist mask 306, and reaches the surface of the second electrode 305 passing through the second interlayer insulating film 304.

And, the depth d2 of the second contact hole 308 corresponds to the value obtained by subtracting the thickness of the second electrode 305 from the thickness of the second interlayer insulating film 304. Namely, the depth d2 of the second contact hole 308 is shallower than the depth d1 of the first contact hole 307(d1>d2).

Further, the dimension of the second contact hole 308 in the horizontal direction is defined by the dimension D2 in the horizontal direction of the second opening portion 306-2 in the resist mask 306.

As stated previously, the first contact hole 307 and the second contact hole 308 are formed by the same etching process using the same resist mask 306. In this case when the etching depth reaches d2 in the location of C1, the surface of the second electrode 305 is revealed, and as the result, the second contact hole 308 is formed, and the etching operation in C1 should be the state of etching off.

On the other hand, in the location of C2 at that time the second interlayer insulating film 304 is not completely removed and moreover the first interlayer insulating film 303 is not yet etched. Accordingly, the etching operation in C2 continues until the surface of the first electrode 302 is revealed. Thus, the etching process terminates when the first interlayer insulating film 303 is etched, and the surface of the first electrode 302 is revealed, thereby forming the first contact hole 307.

In the case, there is a problem that the revealed surface of the second electrode 305 is subjected to damage through over etching in the etching operation until the surface of the first electrode 302 is revealed after the surface of the second electrode 305 has been revealed. Because the first electrode 302 and the second electrode 305 are made of materials such as metals which etching rate are substantially small compared with those of the first interlayer insulating film 303 and the second interlayer insulating film 304, the second contact hole 308 is not formed passing through the second electrode 305. However, as stated, the revealed surface of the second electrode 305 is continued to be disposed by etching until the surface of the first electrode 302 is revealed. For example, the revealed surface of the second electrode 305 is subjected to damage through over etching by the time interval (T2−T1) from the time T1 when the surface of the second electrode 305 is revealed to the time T2 when the surface of the first electrode 302 is revealed.

As illustrated in FIG. 3C, the resist mask 306 is removed by the known method. Then, as illustrated in FIG. 3D, a first wiring layer 309 and a second wiring layer 310 are formed by the known method. In this case, the first wiring layer 309 lies with the spread on the revealed surface of the first electrode 302 and along the side wall of the first contact hole 307. On the other hand, the second wiring layer 310 lies with the spread on the revealed surface of the second electrode 305 which was exposed through over etching, and along the side wall of the second contact hole 308.

As the result, a substrate provided with the first contact hole 307 and the second contact hole 308 is formed wherein the first contact hole 307 is formed to have a deep hole with the depth of d1 reaching the first electrode 302, and the second contact hole 308 is formed to have a shallow hole with the depth of d2 reaching the second electrode 305 exposed through over etching.

Thereafter, the target semiconductor is manufactured by the known method. This third prior art is illustrated in FIG. 15 of the Japanese patent No. 3,208,658 as the contact holes 42 and 43.

Referring to FIGS. 1A to 1D, the first prior art mentioned above discloses that the contact hole with the minute dimension exceeding the limit of exposure is formed through etching using as a mask the transformed resist film obtained by transforming an organic resist film through the thermal reflow. However, the first prior art making use of the thermal reflow includes the following drawback.

1) The first problem is that in case of unevenness in the photo resist width, the degree of tapering in photo resist patterns after the thermal reflow becomes uneven because the shape at the reflow portion depends on the width of photo resist patterns.

2) The second problem is that tapering by thermal reflow involves diminishing of the dimension of the photo resist pattern in the horizontal direction. The thermal reflow causes to increase the dimension in the horizontal direction, while the organic pattern involves contraction in volume when it is subjected to heat treatment. Namely, there exists a limitation in increasing the dimension in the horizontal direction, because the thermal reflow causes contraction in volume of the organic pattern due to heat, in addition to increase of the dimension in the horizontal direction due to fluidization.

3) The third problem is that because the thermal reflow is a reflow with high viscosity, the front shape of the reflow becomes undulant and uneven, and as the result, such mask due to the thermal reflow for etching allows often to form side etching, thereby causing wiring with inadequate tapered shape, that is, the cross section of the wiring with the shape of vertical or partially reverse tapered.

Also, referring to FIGS. 2A to 2C, the second prior art mentioned above discloses that the contact hole with forward tapered though only a little by conducting etching using the resist mask formed by the known process of lithography without changing the resist mask. However, the second prior art includes the following drawback. Namely, the degree of angle of the tapered shape in the contact hole with the forward tapered shape due to the second prior art is only a little, and therefore it is impossible for the second prior art to be applied to forming a contact hole necessary for a large or significant forward tapering.

Referring to FIGS. 3A to 3D, the third prior art mentioned above discloses that a plurality of contact holes with different depth are formed in one time process of lithography. However, the third prior art includes the following drawback.

As stated previously, because the shallow contact hole is exposed through over etching the following two problems arise. The first problem is that the surface of the second electrode to which the shallow contact hole reaches is subjected to heavy damage by over etching, and later that causes burnout failure in the second wiring lying with the spread on the surface of the second electrode and along the side wall of the shallow contact hole, and causes increase of contact resistance between the second wiring and the surface of the second electrode.

The second problem is that forming forward tapered shape of the contact hole becomes difficult. This is caused in a way that the side wall adjacent to the bottom of the shallow contact hole is over etched, then the side wall in the lower area of the contact hole retracts outwardly in the horizontal direction, and then the side wall of the contact hole is formed to be vertical gradually, which has with a slope at first, even if the shallow contact hole has been formed with forward tapered shape.

As the countermeasures to the first and second problems with regard to the third prior art mentioned above, it is presumable that the over etching in the shallow contact hole is avoided by means of delaying the starting time of etching to form the shallow contact hole than the starting time of etching to form the deep contact hole, using a half exposure method. The half exposure technology is disclosed in the Japanese laid open patent No. 2000-164584. This half exposure technology will be explained as the fourth prior art in below.

Specifically, a resist mask provided with a first opening portion and a thin portion in film thickness is formed making use of the half exposure technology. Then, the first opening portion is aligned to a position in which the deep contact hole is formed, while the thin portion in film thickness is aligned to a position in which the shallow contact hole is formed. In the initial process of etching, etching operation through the first opening portion is conducted for only forming the deep contact hole using the resist mask provided with the first opening portion and the thin portion in film thickness.

Then, at the time when the etched depth reaches a given depth to form the deep contact hole, the etching operation is interrupted, and then a second opening portion is formed through removing the thin portion in film thickness. And in addition to restart etching operation for the deep contact hole a new etching operation starts to form the shallow contact hole, using the transformed resist mask provided with the first and second opening portions. Both of etching to form the deep contact hole and etching to form the shallow contact hole are conducted at the same time. Both of etching to form contact holes, each having different depth, can be terminated at the same time, for example, in case that the given depth is defined as the difference between the depth of the deep contact hole and the depth of the shallow contact hole. Accordingly, it is possible to avoid the first and the second problems with regard to the third prior art because no over etching occurs.

However, the fourth prior art, though it makes use of the half exposure technology, still includes the following drawback. As stated previously, it is necessary to prepare the resist mask which is provided with the first opening portion and the thin portion in film thickness is formed, making use of the half exposure technology. Accordingly, the number of processes for manufacturing increases, compared with the ordinary cases in which a resist mask is made of the same film thickness, and then the manufacturing cost increases. Also, further processes are required to remove the thin portion in film, thickness of the resist mask and then to form the second opening portion that leads to increase of the number of manufacturing process and the cost.

Accordingly, it has been desired to provide a novel method for forming a contact hole without drawbacks and problems included in the prior arts mentioned above.

DISCLOSURE OF THE INVENTION

Problem to be Solved by the Invention

The object of the present invention is to provide a novel etching method without drawbacks and problems included in the prior arts.

Namely, the object of the present invention is to provide a method for forming an etching structure without difficulty to control the manufacturing conditions, and with a minute dimension exceeding the limit of exposure, while suppressing increase of manufacturing processes and increasing of manufacturing cost.

Another object of the present invention is to provide a method for forming a plurality of etching structures with different depth without over etching in one time process of lithography, while suppressing increase of manufacturing processes and increasing of manufacturing cost.

Still another object of the present invention is to provide a method for forming an etching structure with largely inclined and forward tapered shape, while suppressing increase of manufacturing processes and increasing of manufacturing cost.

Further, the object of the present invention is to provide a method for forming a contact hole without difficulty to control the manufacturing conditions, and with a minute dimension exceeding the limit of exposure, while suppressing increase of manufacturing processes and increasing of manufacturing cost.

Another object of the present invention is to provide a A method for forming a plurality of contact holes with different depth without over etching in one time process of lithography, while suppressing increase of manufacturing processes and increasing of manufacturing cost.

Still another object of the present invention is to provide a method for forming contact hole with largely inclined and forward tapered shape, while suppressing increase of manufacturing processes and increasing of manufacturing cost.

Means for Solving the Problem

According to a first aspect of the present invention, the present invention at least includes,
  a process for forming an organic mask having a first opening portion in which a first etching structure is formed and a second opening portion in which a second etching structure provided with a upper etching structure is formed, by patterning an organic film which includes either one of an organic film and a film with the addition of organic solvent and is located on a constituent part to be etched, and
  a process for forming a transformed organic mask by dissolving the organic mask in contact with organic solvent and reflowing.

Through those processes it is possible to form a plurality of etching structures with different depth without over etching in one time process of lithography, while suppressing increase of manufacturing processes and increasing of manufacturing cost.

According to a second aspect of the present invention, the present invention is to provide a method for etching which includes
  a process for forming an organic mask having a first opening portion and a second opening portion by patterning an organic film which includes either one of an organic film and a film with the addition of organic solvent and is located on a constituent part to be etched,
  a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask,
  a process for forming a transformed organic mask by dissolving the organic mask in contact with organic solvent, reflowing and at least filling a bottom of the first etching structure with a part of re-flown organic mask while leaving a upper etching structure unfilled, and
  a process for forming the first etching structure with the first final target level of depth and a second etching structure with a second final target level of depth, provided with the upper etching structure and a lower etching structure, by forming the lower etching structure lying just below the upper etching structure while selectively etching the constituent part to be etched to a depth of the second final target level which is deeper than that of the first final target level without any etching damages to the bottom of the first etching structure using the transformed organic mask. In addition thereafter, the transformed organic mask is removed.

By means of using the process for forming the transformed organic mask through reflow in dissolving in which the reflow in dissolving fills at least the bottom of the first etching structure while leaving the upper etching structure unfilled, it becomes possible to certainly prevent that the bottom of the shallower first etching structure is subjected to damage by over etching, in case of forming the shallower first etching structure and the deeper second etching structure while using the common organic mask.

According to a third aspect of the present invention, the present invention is to provide a method for etching which includes
  a process for forming an organic mask having a first opening portion and a second opening portion having a dimension larger than that of the first opening portion by patterning an organic film which includes either one of an organic film and a film with the addition of organic solvent and is located on a constituent part to be etched,
  a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask,
  a process for forming a transformed organic mask in a way that by dissolving the organic mask in contact with organic solvent and reflowing, a part of the organic mask is running and sagging along a side wall of the first etching structure and along a side wall of a upper etching structure of the second etching structure, so that the re-flown organic mask fills both of the side walls and at least a bottom of the first etching structure while leaving a bottom of the upper etching structure unfilled, and
  a process for forming the first etching structure with the first final target level of depth and a second etching structure with a second final target level of depth and with forward tapered in a staircase pattern, the second etching structure providing with the upper etching structure and a lower etching structure lying just below the upper etching structure and having a horizontal dimension smaller than that of the upper etching structure in the second etching structure, while selectively etching the constituent part to be etched to the depth of the second final target level which is deeper than that of the first final target level, without any etching damages to the bottom of the first etching structure using the transformed organic mask.

In addition thereafter, the transformed organic mask is removed.

The horizontal dimension of the lower etching structure in the second etching structure is smaller than that of the upper etching structure, by the quantity corresponding to approximately two times of the thickness formed in the horizontal direction of the transformed organic mask after reflow in dissolving runs and sags along the side wall of the upper etching structure.

Namely, the difference of the horizontal dimension of the lower etching structure in the second etching structure and the horizontal dimension of the upper etching structure depends on the thickness in the horizontal direction of the transformed organic mask, which is formed after reflow in dissolving runs and sags along the side wall of the upper etching structure.

Accordingly, in addition to preventing that the bottom of the shallower first etching structure is subjected to damage by over etching, the reflow in dissolving makes it possible to,form the deeper second etching structure with a staircase pattern and forward tapered shape without adding a new process.

According to a fourth aspect of the present invention, the present invention is to provide a method for etching which includes a process for forming an organic mask having a first opening portion and a second opening portion by patterning an organic film which includes either one of an organic film and a film with the addition of organic solvent and is located on a constituent part to be etched, a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask, a process for forming a transformed organic mask in a way that by dissolving the organic mask in contact with organic solvent and reflowing, a part of the organic mask is running and sagging along a side wall of the first etching structure, so that the re-flown organic mask fills the side wall of the first etching structure and at least a bottom thereof while leaving inside of the upper etching structure unfilled, and a process for forming the first etching structure with the first final target level of depth and a second etching structure with a second final target level of depth, the second etching structure providing with the upper etching structure and a lower etching structure lying just below the upper etching structure in the second etching structure, by selectively etching the constituent part to be etched to the depth of the second final target level which is deeper than that of the first final target level, without any etching damages to the bottom of the first etching structure using the transformed organic mask.

In addition thereafter, the transformed organic mask is removed.

By means of using the process for forming an unfilled transformed organic mask inside the upper etching structure through reflow in dissolving while filling the side wall of the first etching structure and at least the bottom thereof, it becomes possible to certainly prevent that the bottom of the shallower first etching structure is subjected to damage by over etching, in case of forming the shallower first etching structure and the deeper second etching structure while using the common organic mask.

According to a fifth aspect of the present invention, the present invention is to provide a method for etching which includes a process for forming an organic mask having a first opening portion and a second opening portion, and having a thickness in the vicinity of the second opening portion thinner than other portions by patterning an organic film which includes either one of an organic film and a film with the addition of organic solvent and is located on a constituent part to be etched, a process for forming a first etching structure with a first final target level of depth and is located below the first opening portion, and for forming a upper etching structure with a depth equal or similar to the first final target level of depth by selectively etching the constituent part to be etched using the organic mask, a process for forming a transformed organic mask in a way that by dissolving the organic mask in contact with organic solvent and reflowing, a part of the organic mask is running and sagging along a side wall of the first etching structure, so that the re-flown organic mask fills the side wall of the first etching structure and at least a bottom thereof while leaving inside of the upper etching structure unfilled, and a process for forming the first etching structure with the first final target level of depth and a second etching structure with a second final target level of depth, the second etching structure providing with the upper etching structure and a lower etching structure lying just below the upper etching structure in the second etching structure, by selectively etching the constituent part to be etched to the depth of the second final target level which is deeper than that of the first final target level, without any etching damages to the bottom of the first etching structure using the transformed organic mask.

In addition thereafter, the transformed organic mask is removed.

By means of using the process for forming an unfilled transformed organic mask inside the upper etching structure through reflow in dissolving while filling the side wall of the first etching structure and at least the bottom thereof, it becomes possible to certainly prevent that the bottom of the shallower first etching structure is subjected to damage by over etching, in case of forming the shallower first etching structure and the deeper second etching structure while using the common organic mask.

In order to form an organic mask thinner than film thickness of the areas in the vicinity of the second opening portion, the available known methods of technology may be utilized. The half exposing method and the printing method are included as the typical examples, but not necessarily limited to those. In case of using the half exposing method, it involves increase of the number of processes, as stated previously. So, the printing method is preferable to avoid that.

According to a sixth aspect of the present invention, the present invention is to provide a method for etching which includes a process for forming an organic mask having a first opening portion and a second opening portion, and having a thickness in the vicinity of the second opening portion thinner than other portions by patterning an organic film which includes either one of an organic film and a film with the addition of organic solvent and is located on a constituent part to be etched, a process for forming a first etching structure with a first final target level of depth and is located below the first opening portion, and for forming a upper etching structure with a depth equal or similar to the first final target level of depth by selectively etching the constituent part to be etched using the organic mask, a process for removing only a portion with thinner film thickness in the vicinity of the second opening portion, a process for forming a transformed organic mask in a way that by dissolving the organic mask in contact with organic solvent and reflowing, a part of the organic mask is running and sagging along a side wall of only the first etching structure, so that the re-flown organic mask fills the side wall of the first etching structure and at least a bottom thereof while leaving inside of the upper etching structure unfilled, though the re-flown organic mask reaches a vicinity area of the upper end of the upper etching structure, and a process for forming the first etching structure with the first final target level of depth and a second etching structure with a second final target level of depth, the second etching structure providing with the upper etching structure and a lower etching structure lying just below the upper etching structure in the second etching structure, by selectively etching the constituent part to be etched to the depth of the second final target level which is deeper than that of the first final target level, without any etching damages to the bottom of the first etching structure using the transformed organic mask.

In addition thereafter, the transformed organic mask is removed.

By means of using the process for forming an unfilled transformed organic mask inside the upper etching structure through reflow in dissolving while filling the side wall of the first etching structure and at least the bottom thereof, it becomes possible to certainly prevent that the bottom of the shallower first etching structure is subjected to damage by over etching, in case of forming the shallower first etching structure and the deeper second etching structure while using the common organic mask.

In order to form an organic mask thinner than film thickness of the areas in the vicinity of the second opening portion, the available known methods of technology may be utilized. The half exposing method and the printing method are included as the typical examples, but not necessarily limited to those. In case of using the half exposing method, it involves increase of the number of processes, as stated previously. So, the printing method is preferable to avoid that.

Also, the ashing process of the organic mask is included as a typical example of the process for removing only the thin portion in film thickness of the areas of the organic mask in the vicinity of the second opening portion, but not necessarily limited to it.

Effect of the Invention

According to the first to sixth aspects of the present invention mentioned above. By using the process for forming an unfilled transformed organic mask inside the upper etching structure through reflow in dissolving while filling at least the bottom of the first etching structure, it becomes possible to certainly prevent that the bottom of the shallower first etching structure is subjected to damage by over etching, in case of forming the shallower first etching structure and the deeper second etching structure while using the common organic mask.

Also, in addition to preventing that the bottom of the shallower first etching structure is subjected to damage by over etching, the reflow in dissolving makes it possible to form the deeper second etching structure with a staircase pattern and forward tapered shape without adding a new process.

In addition, the organic film and the organic mask with regard to the present invention may be typically a resist film and a resist mask. So, the following will be explained in the case of using the resist film and the resist mask as the typical examples of the organic film and the organic mask. But the present invention is not necessarily limited to those.

Best Mode of Carrying Out the Invention

As stated previously, according to the first to sixth aspects of the present invention, in the method for forming the first and the second etching structures each having a different etching depth using one time process of lithography, it becomes possible to prevent that the bottom of the first etching structure with the depth being shallow is subjected to the damage by etching of the second etching process, by means of forming the organic mask, that is, the resist mask including either one of an organic film and a film with the addition of organic solvent, transforming the resist mask by the reflow in dissolving after conducting the first etching process using the resist mask, and conducting the second etching process using the transformed resist film as a mask.

Namely, in the second etching process which is conducted using the transformed resist film as a mask, the formation of the first etching structure has finished through the first etching process conducted using the resist mask made by patterning. And through the reflow in dissolving thereafter, at least the bottom of the first etching structure is covered or filled by the transformed resist mask re-flown by dissolving. Accordingly, the bottom of the first etching structure is not over etched, and is not subjected to damages.

On the other hand, with regard to the second etching structure, the bottom of the upper etching structure formed in the first etching process is not completely covered with the transformed resist mask, even though it is partially covered by the transformed resist mask re-flown by dissolving. For example, according to the above second aspect of the present invention, the resist is re-flown along the side wall of the upper etching structure. But the central areas of the bottom of the upper etching structure is in the state of exposure without the transformed resist mask re-flown by the reflow in dissolving. Also, according to the above third to the fifth aspects of the present invention, the resist is not re-flown inside the upper etching structure, and it follows that the bottom of the upper etching structure is in the state of exposure without the transformed resist mask re-flown by the reflow in dissolving.

By conducting the second etching process using this transformed resist mask re-flown by the reflow in dissolving, the bottom of the upper etching structure is further etched and as the result, the lower etching structure is formed, which is located just below the upper etching structure and adjacent to it continuously.

The first etching structure has a depth of final target level. The upper etching structure in the second etching structure has the depth of the same or similar to the depth of the first final target level. Therefore, even if there are arranged at the bottom portion in the first etching structure the conductive constituent parts such as electrodes and wirings, there is no possibility that the conductive constituent parts are etched or subjected to substantial damages in the first etching process.

Then, the resist mask is re-flown by reflow in dissolving, and the part of the re-flown transformed resist mask completely covers the bottom of the first etching structure so that the bottom of the first etching structure is not etched and is not subjected to damages in the successive second etching process.

It is only necessary that at least the bottom among the first etching structure is covered or filled with the part of the re-flown transformed resist mask. So, it is not necessary that the first etching structure is completely filled with the part of the re-flown transformed resist mask. Of course, the first etching structure may be completely filled. For example, in case of having a large dimension in the horizontal direction in the first etching structure, or in case of having a large volume in the first etching structure, the volume of resist more than the volume of the first etching structure is required to flow in the first etching structure by the reflow in dissolving to completely fill the first etching structure. In case that it is difficult to bring such a reflow of resist exceeding the volume of the first etching structure, or in case of causing disadvantage or inconvenience, the reflow may be stopped at the time when the bottom of the first etching structure is fully covered to avoid complete filling of the first etching structure.

In addition, in case of having not so large dimension in the horizontal direction in the first etching structure, in case of having not so voluminous or in case of having not so large aspect ratio in the first etching structure, there is a possibility that it is relatively easy to fill the first etching structure completely by the reflow of the resist. Under such a condition the first etching structure can be filled completely with the reflow of the resist In addition, even if it is difficult for the resist re-flown in dissolving to directly reach the bottom of the first etching structure because the dimension in the horizontal direction of the first etching structure is extremely small, and the aspect ratio of the first etching structure is very large, there is no possibility that the bottom of the first etching structure is etched or subjected to damages in the successive second etching process when the resist re-flown in dissolving reaches the upper or middle portion of the first etching structure and then, as the result, the bottom of the first etching structure is indirectly covered by the resist re-flown in dissolving.

As a conclusion, through the reflow in dissolving of the resist which is conducted before the second etching process is started, the bottom of the first etching structure is covered with the resist re-flown, so that the bottom of the first etching structure is not etched or is not subjected to damages in the successive second etching process.

On the other hand, as stated previously, the bottom of the upper etching structure in the second etching structure is not covered even after the reflow in dissolving of the resist. For example, according to the above second aspect of the present invention, the resist runs and sags by the reflow in dissolving along both of the side walls in the upper etching structure and the first etching structure.

In this case, for example, in case that the dimension in the horizontal direction of the upper etching structure is larger than the dimension in the horizontal direction of the first etching structure, the upper etching structure is not filled and the bottom of the upper etching structure is in the state of exposure, though the resist re-flown along the side wall in the upper etching structure remains there at the time when the first etching structure is completely filled with the resist re-flown by the reflow in dissolving.

And then the second etching process is conducted using the transformed resist mask formed by the reflow in dissolving, so that the lower etching structure is formed by etching the exposure portion of the bottom in the upper etching structure. Because of this, the dimension in the horizontal direction of the lower etching structure is smaller than the dimension in the horizontal direction of the upper etching structure, by the quantity corresponding to approximately two times of the film thickness of the resist re-flown on the wall in the upper etching structure.

As the result, the second etching structure is formed with a staircase pattern and forward tapered, which is constituent of the upper etching structure and the lower etching structure with a dimension in the horizontal direction smaller than that of the upper etching structure.

According to the above fourth to sixth aspects of the present invention, the resist runs and sags by the reflow in dissolving along both of the side wall. But the re-flown resist is not re-flown in the upper etching structure.

For example, according to the above fifth aspect of the present invention, before the resist is re-flown in dissolving the thickness of resist is formed so as to be thin in the surrounding area or in the vicinity of the second opening portion. To do so, the resist portion in the surrounding area or in the vicinity of the second opening portion becomes small in volume when the resist portion is re-flown in dissolving, so that the reflow in dissolving of the resist is stopped at the surrounding area of the upper end in the upper etching structure lying below the second opening portion, and as the result the resist is suppressed to run and sag along the side wall of the upper etching structure.

For example, according to the above sixth aspect of the present invention, in order to avoid reflow into the upper etching structure, after forming the first etching structure and the upper etching structure by conducting the first etching process using the resist mask which is formed so as to be thin in the surrounding area or in the vicinity of the second opening portion, the resist mask is processed so that the thin portion in film thickness in the surrounding area or in the vicinity of the second opening portion is removed. Then, the reflow in dissolving of the resist mask is conducted so that the reflow in dissolving of the resist is stopped at the surrounding area of the upper end in the upper etching structure lying below the second opening portion, and as the result the resist is suppressed to run and sag along the side wall of the upper etching structure.

In the case, it is important that the re-flown resist is just stopped at the portion of the surrounding area of the upper end in the upper etching structure, through forming the resist mask in a way that the distance of the thin portion in film thickness of the resist mask corresponds to the distance of the reflow in dissolving. In case that the reflow in dissolving does not reach, the surrounding area of the upper end in the upper etching structure is exposed without being covered by the resist. In case of conducting the second etching process under such condition, the surrounding area of the upper end in the upper etching structure is also etched.

To avoid this, it is necessary to stop the reflow in dissolving at the time when the re-flown resist has reached the upper end in the upper etching structure. As stated previously, at that time it is only necessary that the bottom of the first etching structure is filled with the reflow in dissolving, even if the first etching structure is not completely filled with the reflow in dissolving.

Accordingly, the timing to stop the reflow in dissolving is arranged to match with the timing when the reflow in dissolving reaches the upper end in the upper etching structure, because there causes nothing troublesome in case that bottom of the first etching structure is already filled with the reflow in dissolving at the time when the reflow in dissolving reaches the upper end in the upper etching structure.

Then, the lower etching structure is formed through etching the exposed portion in the bottom of the upper etching structure by conducting the second etching process using the transformed resist mask formed with the reflow in dissolving. To this end, the dimension in the horizontal direction of the lower etching structure becomes nearly equal to the dimension in the horizontal direction of the upper etching structure. As the result the second etching structure becomes to be formed substantially without tapered shape, which is provided with the upper etching structure and the lower etching structure having approximately the same dimension in the horizontal direction with the dimension of the upper etching structure.

Furthermore, according to the above first to fourth aspects of the present invention, through transforming a resist mask prior to the first etching process and diminishing the dimension in the horizontal direction of the opening portion in the resist mask, the first etching process can be conducted using the transformed resist mask with a pattern of the diminished dimension in the horizontal direction. In this case, at least either one of the first and the second etching structures can be miniaturized with regard to the dimension in the horizontal direction exceeding the limit of exposing.

The reflow in dissolving means that through penetrating medicinal solution which dissolves an organic film or a film with the addition of organic solvent into the film, the film is dissolved by the medicinal solution, and as the result it re-flows. This reflow is called "reflow in dissolving by medicinal solution" or "reflow in medicinal solution". However in the present invention, it is called "reflow in dissolving" collectively.

The above medicinal solution dissolving an organic film or a film with the addition of organic solvent includes organic solvent.

To penetrate the organic solvent into the organic film or the film with the addition of the organic solvent the film is exposed in the atmosphere of vaporized organic solvent or is immersed in the diluted solution of the organic solvent. By this, the organic film or the film with the addition of the organic solvent is transformed ho a transformed resist mask having a minute dimensional pattern exceeding the limit of exposing, so that a part of the film to be etched lying below the resist mask is removed while using the transformed resist mask.

As a typical example of the constituent part to be etched, there can be cited a layer like or a film like constituent part, specifically an insulating film such as an interlayered insulating film with a single layered or multi layered structure. However the constituent part to be etched is not limited to those. Only need is to be a constituent part which can be etched. Also, with regard to substance of the constituent part, it is not limited to a specified substance and any substance which can be etched is utilized.

The etching structure in the present invention means as defined previously. A contact hole, as the typical example thereof, can be cited. But the etching structure is not limited to the contact hole, and includes a via hole, a through hole, and a groove structure or all structures formed by etching. Furthermore, as the typical example of the constituent part where the bottom of the contact hole reaches, a variety of electrodes can be cited such as a gate electrode, a control electrode, a source electrode or a drain electrode. But the constituent part is not limited to those electrodes. Also, such as wiring layers can be cited as the typical example of the constituent part where the bottom of the via hole or the through hole reaches. But the constituent part is not limited to those. In addition, in case of the groove structure etching may be stopped at the time on the way so as not to pass through the constituent part, or at the time on the way so as to pass through it. In any way, a structure formed by etching is not limited to a specified one.

Further, in case that the resist mask is provided with a resist pattern with the opening portion, the dimension in the horizontal direction of the opening portion diminishes in size through the reflow in dissolving of the resist mask. Accordingly, the reflow in dissolving of the resist mask makes it possible to miniaturize of the dimension in the horizontal direction of the opening portion, which exceeds the limit of exposing even if miniaturization of the dimension of the opening portion prior to the transformation is limited because of the limit of exposing.

Further, as explained previously referring to FIGS. 2A to 2C as the second prior art, the resist mask of the opening portion formed by the lithography technology, generally is formed with the inclined and forward tapered shape, though it is very little. However, because the extent or degree of the inclined and forward tapered shape is a very little, even if etching is conducted using this resist mask, the longitudinal cross sectional shape is also inclined and forward tapered only a very little.

However, according to the above fourth to sixth aspects of the present invention, a deep etching structure with a staircase pattern or step like and forward tapered shape can be formed.

In the above methods according to the above fourth to sixth aspects of the present invention, there are provided with the thermal reflow and the reflow in dissolving with regard to reflow of the resist. But the reflow in dissolving is superior to the thermal reflow in the following points. Namely, The photo resist pattern which is one example of the organic pattern causes the next three problems in forming tapered shape using the thermal reflow.

1) The first problem is that, because the shape of re-flown portion after the thermal reflow depends on a width of the photo resist pattern, the degree of the tapered shape of the photo resist pattern after the thermal reflow becomes uneven in case of unevenness in the width of the photo resist pattern.

2) The second problem is that the tapered shape by the thermal reflow involves decrease of the dimension of the photo resist pattern in the horizontal direction. The thermal reflow causes contraction in volume of the organic pattern when the organic pattern is subjected to heat treatment, while causing increase of the dimension in the horizontal direction. Namely, because the thermal reflow causes contraction in volume of the organic pattern by heating, together with the increase of the dimension in the horizontal direction by fluidization, the increase of the dimension in the horizontal direction is not so large compared with the increase of the dimension of the reflow in dissolving. On the contrary, the reflow in dissolving need not to heat at high temperature particularly. In reverse, the reflow in dissolving does not cause contraction in volume of the organic pattern because of the processing at low temperature which need not to heat at high temperature, in addition to the increase of the dimension in the horizontal direction by fluidization at low temperature, and causes only expansion in volume of the organic pattern due to the penetration of organic solvent. By this reason, it is advantageous to apply the reflow in dissolving rather than the thermal reflow in order to diminish the pattern distance. In this regard, there is a case that heating is conducted after the reflow in dissolving. However, the heating is conducted for vaporizing and drying penetrated solvent, and then the temperature is not so high as causing the reflow in dissolving. Otherwise, the case is directed to seek an effect due to a combination of the reflow in dissolving and the thermal reflow. The processing itself of the reflow in dissolving does not require the high temperature.

3) The third problem is that because the thermal reflow is a reflow with high viscosity, the front shape of the reflow becomes undulant and uneven, and as the result, such a mask due to the thermal reflow for etching allows often to form side etching, thereby causing the cross section of the etching structure with the shape of vertical or partially reverse tapered. On the other hand, because the reflow in dissolving is a reflow with low viscosity, the front shape of the reflow becomes a lubricious and ideal shape without undulant that enable not to cause the side etching and to have enough large tapered shape in the cross section of the etching structure.

The above resist films may be constituted of any one of a single layered structure of an organic film, a multi layered structure of organic films, a single layered structure of a film with the addition of organic solvent, a multi layered structure of films with the addition of organic solvent, or a multi layered structure of organic films and films with the addition of organic solvent. Here, the organic film is mainly constituted of organic system material and organic solvent, and on the other hand the film with the addition of organic solvent is mainly constituted of inorganic system material and organic solvent.

As the typical organic system material, there may be cited such as resin of known material for resist, acrylic, polyimide, polyacrylamide, and polymer organic material.

As the typical inorganic system material, there may be cited such as siloxane, polysiloxane, polysilane, polysilene, carbosilane, silicon, inorganic glass.

As to the typical organic solvent, all of the organic solvent medical solutions described below is available.

Organic solvent (R indicates alkyl group or substitution alkyl group, and Ar indicates phenyl group or aromatic ring except phenyl group)
  Alcohol class (R—OH)
  Alkoxy alcohol class
  Ether class (R—O—R, Ar—O—R, Ar—O—Ar)
  Ester class
  Keton class
  Glycol class
  Alkylene glycol class
  Glycol ether class Also, the organic film may be constituted of water soluble material. In the case, as the typical examples of the water soluble material□ there may be cited one kind of, or composite including more than one of, or material including those salt as main components, or material which mixes inorganic material to the materials described below, such as polyacrylic acid, polyvinyl acetal, polyvinyl pyrrolidone, polyvinyl alcohol, polyethylene imine, polyethylene oxide, stylene-maleic anhydride copolymerization, polyvinyl amine, polyallyl amine, oxazoline group including water soluble resin, water soluble melamine resin, water soluble urea resin, alkid resin, sulfonamide.

Similar processing effects may be obtained by using liquid solution of organic solvent as the medicinal solution in case that the organic film is mainly constituted of organic material which is soluble to organic solvent or inorganic material, and by using water solution including at least water in case that the organic film is mainly constituted of water soluble organic solvent and organic material, or organic solvent and inorganic material.

In the following, in case that the organic film is constituted of organic system material which is soluble to particularly organic solvent, an example of the first method of reflow as the reflow method mentioned above using solution of organic solvent for medicinal solution, that is, the reflow method which exposes in the vapor of medicinal solution will be explained.

But, it is also possible to use as the material for the organic film such as, the organic film mainly constituted of inorganic system material and organic solvent, the organic film mainly constituted of water soluble material and composite of water soluble material and inorganic material, and as to the reflow method, it is also possible to use the second reflow method, that is, the method which immerses in the medicinal solution.

As the typical examples of the kinds of the resist, there may be cited, such as the photo resist sensitive to ultraviolet ray, the X ray resist sensitive to X ray and the electron beam resist sensitive to electron beam. But the resist is not limited to those. As to the material of the resist, the following organic resist is preferable. For example, there are the resist constituted of only organic material, and the resist constituted of composite of organic material and inorganic material among the resist made of high polymer compound, photographic sensitive material and the other addition agents.

As the typical examples of the resist constituted of only organic material, there may be included the followings, but not limited to the followings.

As the example of the polyvinyl system resist, there can be cited polyvinyl ester cinnamate. Also, as the example of the gum system resist, there can be cited composite substance made of mixture of ring formation polyisoplene or ring formation polybutadiene and bisazide compound. As the example of the novolac resin system resist, there can be cited composite substance made of mixture of cresol novolac resin and naphtoquinone azide-5-sulfonic acid ester. Furthermore, as the example of copolymer resin system resist with acrylic acid, there can be cited polyacryl amide and polyamic acid. As the examples of other resist, there can be cited the resist added by bromine or iodine, or the resist including bromine or iodine much therein. on the other hand, as the example of the resist made of mixture of organic material and inorganic material, there can be cited the resist including metal. As the examples of the resist including metal, there can be cited the resist including siloxane, polysiloxane, polysilene or carbosilane, among the resist including silicon. In addition, as the example of the resist including metal other than silicon, there can be cited the resist including germanium.

In addition, the resist mask can be formed with any one of negative type photo resist and positive type photo resist. As the positive type, there is appropriate the composite substance made of mixture of cresol novolac resin and naphtoquinone azide-5-suifonic acid ester, for example, of novolac system. As the negative type, there is appropriate the composite substance made of mixture of ring formation polyisoplene or ring formation polybutadiene and bisazide compound.

The resist film is in contact with organic solvent to cause the reflow in dissolving of the resist film including organic substance. As the typical method of contacting, there can be cited a way that the resist film is exposed in the vapor of organic solvent, or the resist film is immersed in diluting solution of organic solvent. But the way is not limited to those. In brief it is only necessary to contact organic solvent with the surface of the resist film and to penetrate it inside the film. Practically the resist film may be exposed in the vapor of medicinal solution including organic solvent or immersed in diluting solution of the medicinal solution.

As the typical organic solvent included in medicinal solution, at least one of the following organic solvent is included.

Organic solvent (R indicates alkyl group or substitution alkyl group, and Ar indicates phenyl group or aromatic ring except phenyl group)
  Alcohol class (R—OH)
  Alkoxy alcohol class
  Ether class (R—O—R, Ar—O—R, Ar—O—Ar)
  Ester class
  Keton class
  Glycol class
  Alkylene glycol class
  Glycol ether class There can be arranged to lie a conductive constituent part at a location where at least either one of the first and second etching structures reaches, that is, the location just below the etching structure. And through at least either one of the first and second etching structures, it is possible to secure electric conductivity to the constituent part. In the case, as the typical examples of the first and second etching structures, there can be cited a variety of holes such as a contact hole, via hole or a through hole which is used for the purpose of conductivity, or a variety of grooves. And, as the typical examples of the conductive constituent parts located just below the etching structure, there can be cited a variety of electrodes or a variety of wirings. As the typical examples of the variety of electrodes, there can be cited a control electrode as typified by a gate electrode, and a signal electrode as typified by a source electrode or drain electrode. The wiring can be arranged to lie with the spread on the substrate surface or arranged to have higher level than a substrate surface in a multi layered wiring structure.

The conductive constituent parts located just below the etching structure can be constituted of conductive substance such as metal, alloy, metal with high melting point and semiconductor, and in particular the conductive constituent parts located just below the first etching structure with shallow in depth are preferable to be constituted of substance with etching rate smaller than the conductive constituent parts to be etched, such as metal, alloy, metallic nitride or metal with high melting point. It becomes easy to prevent the conductive constituent parts from over etching in the first etching process by constituting of substance with etching rate smaller than the conductive constituent parts to be etched.

Then, in the second etching process to form the lower etching structure in the second etching structure, because the conductive constituent parts located at the bottom of the first etching structure, that is, just below the first etching structure are filled with the resist re-flown by the reflow in dissolving, the bottom of the first etching structure, that is, the conductive constituent parts is not exposed during the second etching process.

As stated previously, the first etching structure is formed to have the depth of the first final target level, and on the other hand, the upper etching structure in the second etching structure, which is simultaneously formed in the first etching process forming the first etching structure, is formed to have the depth equal or similar to the second final target level. Because of this, the conductive constituent parts located just below the first etching structure are not substantially exposed in over etching, and are not substantially subjected to damages.

Also, because the conductive constituent parts located just below the first etching structure is constituted of substance with the etching rate smaller than the etching rate of the constituent part to be etched, the conductive constituent parts are not substantially over etched, and are not substantially subjected to damages, even if the conductive constituent parts are exposed in the etching particles only a little time.

As the typical examples of the conductive constituent parts located just below the above first etching structure, there can be cited below the following metallic film structures.
  ITO film(Indium Tin Oxide film)
  Indium Tin alloy
  Single layered structure formed of Aluminum or Aluminum alloy
  Single layered structure formed of Chromium or Chromium alloy
  Two layered structures with the one layer formed of Aluminum or Aluminum alloy and the other layer formed of Chromium or Chromium alloy
  Two layered structures with the one layer formed of Aluminum or Aluminum alloy and the other layer formed of Titanium or Titanium alloy
  Two layered structures with the one layer formed of Aluminum or Aluminum alloy and the other layer formed of Titanium nitride or Titanium nitride alloy
  Two layered structures with the one layer formed of Aluminum or Aluminum alloy and the other layer formed of Molybdenum or Molybdenum alloy
  Two layered structures with the one layer formed of Chromium or Chromium alloy and the other layer formed of Molybdenum or Molybdenum alloy
  Three layered structures with the first and the third layers formed of Chromium or Chromium alloy and the second layer formed of Aluminum or Aluminum alloy
  Three layered structures with the first and the third layers formed of Molybdenum or Molybdenum alloy and the second layer formed of Aluminum or Aluminum alloy
  Three layered structures with Aluminum or Aluminum alloy, Molybdenum or Molybdenum alloy and Chromium or Chromium alloy
  Three layered structures with Aluminum or Aluminum alloy, Molybdenum or Molybdenum alloy and Titanium or Titanium alloy
  Three layered structures with Aluminum or Aluminum alloy, Titanium nitride or Titanium nitride alloy and Titanium or Titanium alloy Further, when the first etching structure and the upper etching structure are formed through conducting the first etching process using the resist mask, there is a possibility that the surface of the resist mask is subjected to damages by etching and alters. In the case it is preferable to remove the alteration layer formed on the surface of the resist mask, though it is not indispensable.

The process to remove the alteration layer on the surface of the resist mask can be processed typically by the plasma processing or the UV ozone processing.

The plasma processing can be processed using either one of gas for plasma processing including $O_2$ gas, gas for plasma processing including fluorine system gas and gas for plasma processing including mixed gas of $O_2$ gas and fluorine system gas. In case that the gas for plasma processing is fluorine system gas, the gas for plasma processing includes either one of $SF_6$, $CF_4$ and $CHF_3$.

In case that the gas for plasma processing is mixed gas of $O_2$ gas and fluorine system gas, the gas for plasma processing includes either one of $SF_6/O_2$, $CF_4/O_2$ and $CHF_3/O_2$ In the fifth and the sixth aspects of the present invention, the known method such as the half exposure method and the printing method can be applied to form the resist mask so as to be thinned in the surrounding area or in the vicinity of the second opening portion. As to the method for control partial thickness of the film of the resist mask, there can be cited, (1) A method for forming a resist mask, through forming a light shielding portion and a half shielding portion which controls transmitted amount of light by means of at least two stages or more on the mask pattern of reticule used in the exposure process, and printing the light shielding portion and the half light shielding portion on the resist film, (2) A method for forming a resist mask, through exposing by the change of exposing light intensity at least two stages or more, using two kinds or more of reticule masks in the exposure process.

Also, in the sixth aspect of the present invention, as a process for processing the resist mask so as to remove the thin portion in thickness in the surrounding area or in the vicinity of the second opening portion, the known method can be applied. As the typical example there can be cited such as the ashing process using Oxygen to the transformed resist mask or the ozone process using ultra violet ray and heating. It is preferable that ashing process is conducted in the atmosphere of Oxygen plasma, and the ashing process is conducted until the thin portion in film thickness is completely removed.

According to the above first to sixth aspects of the present invention, the present invention can be applied to the method for manufacturing every semiconductor device provided with a plurality of etching structures with each different depth. In the case, there is no limitation in the kinds of semiconductor devices. As the examples there can be cited a variety of display device, such as a liquid crystal display device and EL display devices, and an active matrix substrate, such as a thin film transistor substrate as the substrate for the display devices.

The embodiments described below are typical examples for conducting the above first to sixth aspects of the present invention. The subject matter of the present invention is already described in detail, but for the purpose of making it easy to understand the typical embodiments in regard to the first to sixth aspects of the present invention, the following one or more typical and preferred embodiments will be explained referring to the drawings.

EMBODIMENT 1

Embodiment 1 will be explained below. The embodiment 1 corresponds to the typical example that conducts the first to the third aspects of the present invention. FIGS. 4A to 4E illustrate longitudinal cross sectional views showing a series of processes forming a plurality of holes with different depth through one time process of the lithography with regard to the embodiment 1 of the present invention.

As illustrated in FIG. 4A, a first conductive constituent part 2 is selectively formed on a substrate 1. The substrate 1 can be formed with an insulating substrate. The insulating substrate may be, for example, a transparent substrate such as glasses for the use of the liquid crystal display device, and insulating films such as amorphous silicon, silicon dioxide films, silicon nitride films, silicon dioxide films and silicon nitride films for the use of semiconductor integrated circuits. In addition the first conductive constituent part 2 can be formed with a conductive film. As the conductive film, there can be formed with a semiconductor film, a metallic film, an alloy film and metallic silicide film, and for example, in case of a single layer there can be formed with, Chromium, Molybdenum or alloy of them, in case of lamination layers, there can be formed with Chromium•Aluminum or Aluminum•Chromium, and in case of three layers, there can be formed with Molybdenum-Aluminum-Molybdenum. The film thickness constituting the first conductive constituent part 2 can be determined arbitrarily, not limited specifically, and for example, can be in the range of 200 to 500 nm.

The first conductive constituent part 2 effects a role as a gate electrode, for example, but it is not limited to the role.

Then, a first inter layered insulating film 3 is formed on the substrate 1 and the first conductive constituent part 2.

The first inter layered insulating film 3 can be constituted of known material. In addition the film thickness of the first inter layered insulating film 3 is arbitrarily determined so as to be enough thicker than that of the first conductive constituent part 2, and is not necessarily limited specifically.

Thereafter, a second conductive constituent part 5 is selectively formed on the first inter layered insulating film 3. In this case, as illustrated in the figure, the location in the horizontal direction of the second conductive constituent part 5 is different from that of the first conductive constituent part 2. The second conductive constituent part 5 may be constituted of conductive films with a single layered structure or multi layered structures, but the layered structure is not necessarily limited.

For example, as illustrated in FIG. 4A, the second conductive constituent part S may be constituted of a lower layered conductive film 5-1 and an upper layered conductive film 5-2. In case of two layered structures, for example, the lower layered conductive film 5-1 can be constituted of relatively small material in the electric resistance rate, and the upper layered conductive film 5-2 can be constituted of relatively small material in the etching rate.

To do so, it is possible to reduce the electric resistance of the second electrode, that is, the second conductive constituent part 5, and furthermore, it is possible to suppress damages of the second conductive constituent part 5 by over etching in a first etching process described later.

As the conductive film which constitutes the second conductive constituent part 5, there can be constituted of a semiconductor film, a metallic film, an alloy film and metallic silicide film, and for example, in case of a single layer there can be formed with, Chromium, Molybdenum or alloy of them, in case of lamination layers, there can be formed with Chromium•Aluminum or Aluminum•Chromium, and in case of three layers, there can be formed with Molybdenum-Aluminum-Molybdenum.

The film thickness constituting the second conductive constituent part 5 can be determined arbitrarily, not limited specifically, and for example, can be in the range of 200 to 500 nm.

In case of two layered structures, for example, each thickness of the lower layered conductive film 5-1 and the upper layered conductive film 5-2 can be determined arbitrarily taking account of respective roles, for example, in the range of 0.1 to 0.5 μm. The second conductive constituent part 5 effects, for example, as the roles which are a source electrode or a drain electrode except the gate electrode or a ohmic contact except the electrode, or a wiring. However the roles are not limited to those.

Further, a second inter layered insulating film 4 is formed on the first inter layered insulating film 3 and the second conductive constituent part 5. The second inter layered insulating film 4 can be constituted of known material. In addition the film thickness of the second inter layered insulating film 4 is arbitrarily determined so as to be enough thicker than that of the second conductive constituent part 5, and is not necessarily limited specifically.

Thereafter, the resist film constituent of organic film is coated on the second inter layered insulating film 4, and then the known processes of exposing and then developing of the resist film are conducted so that a resist mask 6 is formed on the second inter layered insulating film 4 by patterning. In the case, the resist mask 6 is provided with a first opening portion 6-1 and a second opening portion 6-2. The first opening portion 6-1 is located at the upper area of the second conductive constituent part 5, and the second opening portion 6-2 is located at the upper area of the first conductive constituent part 2. As illustrated in FIG. 4A, the dimension D1 of the first opening portion 6-1 in the horizontal direction is smaller than the dimension D2 of the second opening portion 6-2 in the horizontal direction.

As illustrated in FIG. 4B, the first etching process is conducted using the resist mask 6 in which an isotropic etching is conducted by selecting only the second inter layered insulating film 4, so that a first contact hole 7 and an upper portion 8-1 of a second contact hole is formed inside the second inter layered insulating film 4. As illustrated in FIG. 4B, the first contact hole 7 is formed in accordance with the first opening portion 6-1 of the resist mask 6, passes through only the second inter layered insulating film 4, and reaches the surface of the second conductive constituent part 5. Namely, a portion of the surface of the second conductive constituent part 5 is revealed through the first contact hole 7. And the depth d1 corresponds to the value obtained by subtracting the thickness of the second conductive constituent part 5 from the thickness of the second inter layered insulating film 4. Further, the dimension of the first contact hole 7 in the horizontal direction is defined by the dimension D1 of the first opening portion 6-1 of the resist mask 6 in the horizontal direction.

On the other hand, the upper portion 8-1 of the second contact hole is formed in accordance with the second opening portion 6-2 of the resist mask 6 and passes through only the second inter layered insulating film 4, and reaches the interface of the second inter layered insulating film 4 and the first inter layered insulating film 3. And, the depth d2-1 of the upper portion 8-1 of the second contact hole corresponds to the depth of the second inter layered insulating film 4. Namely, the depth d2-1 of the upper portion 8-1 of the second contact hole is deeper by the depth of the second conductive constituent part 5 than the depth d1 of the first contact hole 7(d2-1>d1). Further, the dimension of the upper portion 8-1 of the second contact hole in the horizontal direction is defined by the dimension D2 of the second opening portion 6-2 of the resist mask 6 in the horizontal direction.

As stated previously, the first contact hole 7 and the upper portion 8-1 of the second contact hole are formed using the same resist mask 6 in the same etching process. Here, when the etching depth reaches the depth d1, a part of the surface of the second conductive constituent part 5 is revealed, so that the first contact hole 7 is formed.

In this case, as illustrated in FIG. 4C, when the resist mask 6 is in contact with organic solvent in the state of cladding, the resist mask 6 is dissolved and then it reflows. When the resist mask 6 reflows, the re-flown resist mask fills not only the bottom of the contact hole 7, but also whole the contact hole 7, because of the diameter of the opening portion small.

On the contrary, because the opening portion of the upper portion 8-1 of the second contact hole has the large diameter D2 and the volume of the second contact hole also is large compared with the first contact hole 7, the first inter layered insulating film 3 is not filled with the resist mask 6 and left with exposure, though the side wall of the upper portion 8-1 of the second contact hole is clad or covered by the re-flown resist.

Successively, as illustrated in FIG. 4D, since the first inter layered insulating film 3 is revealed, the first inter layered insulating film 3 is further etched until the first conductive constituent part 2 is revealed. In this instance, since the etching is conducted in the state that only the side wall 12 of the second inter layered insulating film 4 is clad by the resist mask 6, the first inter layered insulating film 3 is etched in a way that the inner diameter D4 of the contact hole 8 in the second inter layered insulating film 4 which is clad by the resist mask 6 is approximately equal to the inner diameter D3 in the first inter layered insulating film 3. The difference between the inner diameter in the second inter layered insulating film 4 after removing the clad of the resist mask 6 and the inner diameter D3 in the first inter layered insulating film 3 is about two Limes of the thickness in the horizontal direction of the resist mask 6 which had run and sagged along the side wall by the reflow. Accordingly, when the resist mask 6 is removed from the side wall, there is formed a staircase like forward tapered shape with the thickness of the resist mask 6 by means of the inner diameter D4 of the contact hole 8 in the second inter layered insulating film 4 and the inner diameter D3 in the first inter layered insulating film 3.

Successively, as illustrated in FIG. 4E, the resist mask 6 is removed by the known method. And then, a first wiring layer 9 and a second wiring layer 10 is formed by the known method.

In this case, the first wiring layer 9 lies with the spread on the revealed surface of the second conductive constituent part 5, and along the side wall of the first contact hole 7. Specifically, because the inner diameter of the first inter layered insulating film 3 is smaller than the inner diameter of the second inter layered insulating film 4, a step is formed on the side wall of the first wiring layer 9. On the other hand, the second wiring layer 10 lies with the spread on the revealed surface of the first conductive constituent part 2, and along the side wall of the second contact hole 8.

As the result, there are formed a substrate provided with the contact hole 7 with the depth d1 without being subjected to damages in the second conductive constituent part 5, and the contact hole 8 provided with the thickness of the first inter layered insulating film 3, in addition to the depth d2-1 reaching the first conductive constituent part 2 which is etched appropriately.

By means of forming the transformed organic mask through reflow in dissolving, it becomes possible to certainly prevent that the bottom of the shallower first etching structure is subjected to damage by over etching, in case of forming the shallower first etching structure and the deeper second etching structure while using the common organic mask.

EMBODIMENT 2

Embodiment 2 will be explained below. The embodiment 2 corresponds to the typical example that conducts the second, the fourth and the fifth aspects of the present invention. FIGS. 5A to 5E illustrate longitudinal cross sectional views showing a series of processes forming a plurality of holes with different depth through one time process of the lithography with regard to the embodiment 2 of the present invention.

As illustrated in. FIG. 5A, a first conductive constituent part 52 is selectively formed on a substrate 51. The substrate 51 can be formed with an insulating substrate. The insulating substrate may be, for example, a transparent substrate such as glasses for the use of the liquid crystal display device, and insulating films such as amorphous silicon, silicon dioxide films, silicon nitride films, silicon dioxide films and silicon nitride films for the use of semiconductor integrated circuits. In addition the first conductive constituent part 52 can be formed with a conductive film. As the conductive film, there can be formed with a semiconductor film, a metallic film, an alloy film and metallic silicide film, and for example, in case of a single layer there can be formed with, Chromium, Molybdenum or alloy of them, in case of lamination layers, there can be formed with Chromium•Aluminum or Aluminum•Chromium, and in case of three layers, there can be formed with Molybdenum-Aluminum-Molybdenum. The film thickness constituting the first conductive constituent part 52 can be determined arbitrarily, not limited specifically, and for example, can be in the range of 200 to 500 nm.

The first conductive constituent part 52 effects a role as a gate electrode, for example, but it is not limited to the role.

Then, a first inter layered insulating film 53 is formed on the substrate 51 and the first conductive constituent part 52.

The first inter layered insulating film 53 can be constituted of the known material. In addition the film thickness of the first inter layered insulating film 53 is arbitrarily determined so as to be enough thicker than that of the first conductive constituent part 52, and is not necessarily limited specifically.

Thereafter, a second conductive constituent part 55 is selectively formed on the first inter layered insulating film 53. In this case, as illustrated in the figure, the location in the horizontal direction of the second conductive constituent part 55 is different from that of the first conductive constituent part 52. The second conductive constituent part 55 may be constituted of conductive films with a single layered structure or multi layered structures, but the layered structure is not necessarily limited.

For example, as illustrated in FIG. 5A, the second conductive constituent part 55 may be constituted of a lower layered conductive film 55-1 and an upper layered conductive film 55-2. In case of two layered structures, for example, the lower layered conductive film 55-1 can be constituted of relatively small material in the electric resistance rate, and the upper layered conductive film 55-2 can be constituted of relatively small material in the etching rate.

To do so, it is possible to reduce the electric resistance of the second electrode, that is, the second conductive constituent part 55, and furthermore, it is possible to suppress damages of the second conductive constituent part 55 by over etching in a first etching process described later.

As the conductive film which constitutes the second conductive constituent part 55, there can be constituted of a semiconductor film, a metallic film, an alloy film and metallic silicide film, and for example, in case of a single layer there can be formed with, Chromium, Molybdenum or alloy of them, in case of lamination layers, there can be formed with Chromium•Aluminum or Aluminum•Chromium, and in case of three layers, there can be formed with Molybdenum-Aluminum-Molybdenum.

The film thickness constituting the second conductive constituent part 55 can be determined arbitrarily, not limited specifically, and for example, can be in the range of 200 to 500 nm.

In case of two layered structures, for example, each thickness of the lower layered conductive film 55-1 and the upper layered conductive film 55-2 can be determined arbitrarily taking account of respective roles, for example, in the range of 0.1 to 0.5 µm. The second conductive constituent part 55 effects, for example, as the roles which are a source electrode or a drain electrode except the gate electrode or an ohmic contact except the electrode, or a wiring. However the roles are not limited to those.

Further, a second inter layered insulating film 54 is formed on the first inter layered insulating film 53 and the second conductive constituent part 55. The second inter layered insulating film 54 can be constituted of the known material. In addition the film thickness of the second inter layered insulating film 54 is arbitrarily determined so as to be enough thicker than that of the second conductive constituent part 55, and is not necessarily limited specifically.

Thereafter, the resist film constituent of organic film is coated on the second inter layered insulating film 54, and then the known processes of exposing and then developing of the resist film are conducted so that a resist mask 56 is formed on the second inter layered insulating film 54. In the case, the resist mask 56 is provided with a first opening portion 56-1 and a second opening portion 56-2. The first opening portion 56-1 is located at the upper area of the second conductive constituent part 55, and the second opening portion 56-2 is located at the upper area of the first conductive constituent part 52. As illustrated in FIG. 5A, the dimension D51 of the first opening portion 56-1 in the horizontal direction is smaller than the dimension D52 of the second opening portion 56-2 in the horizontal direction.

A staircase like forward tapered shape is formed through half exposing the opening portion 56-2 and ashing thereafter. The thickness D57 in the vicinity of the opening portion 56-2 is thin compared with the ordinary thickness D58 of the resist mask 56.

As illustrated in FIG. 5B, the first etching process is conducted using the resist mask 56 in which an isotropic etching is conducted by selecting only the second inter layered insulating film 54, so that a first contact hole 57 and an upper portion 58-1 of a second contact hole is formed inside the second inter layered insulating film 54. As illustrated in FIG. 5B, the first contact hole 57 is formed in accordance with the first opening portion 56-1 of the resist mask 56, passes through only the second inter layered insulating film 54, and reaches the surface of the second conductive constituent part 55. Namely, a portion of the surface of the second conductive constituent part 55 is revealed through the first contact hole 57. And the depth d51 corresponds to the value obtained by subtracting the thickness of the second conductive constituent part 55 from the thickness of the second inter layered insulating film 54. Further, the dimension of the first contact hole 57 in the horizontal direction is defined by the dimension D51 of the first opening portion 56-1 of the resist mask 56 in the horizontal direction.

On the other hand, the upper portion 58-1 of the second contact hole is formed in accordance with the second opening portion 56-2 of the resist mask 56 and passes through only the second inter layered insulating film 54, and reaches the interface of the second inter layered insulating film 54 and the first inter layered insulating film 53. And, the depth d52-1 of the upper portion 58-1 of the second contact hole corresponds to the depth of the second inter layered insulating film 54. Namely, the depth d52-1 of the upper portion 58-1 of the second contact hole is deeper by the depth of the second conductive constituent part 55 than the depth d51 of the first contact hole 7(d52-1>d51). Further, the dimension of the upper portion 58-1 of the second contact hole in the horizontal direction is defined by the dimension D52 of the second opening portion 56-2 of the resist mask 56 in the horizontal direction.

As stated previously, the first contact hole 57 and the upper portlon 58-1 of the second contact hole are formed using the same resist mask 56 in the same etching process. Here, when the etching depth reaches the depth d51, a part of the surface of the second conductive constituent part 55 is revealed, so that the first contact hole 57 is formed.

In this case, as illustrated in FIG. 5C, when the resist mask 56 is in contact with organic solvent in the state of cladding, the resist mask 56 is dissolved and then it reflows. When the resist mask 56 reflows, the re-flown resist mask fills not only the bottom of the contact hole 57, but also whole the contact hole 57, because of the diameter of the opening portion small.

On the contrary, because the opening portion of the upper portion 58-1 of the second contact hole has the large diameter D52 and the volume of the second contact hole also is large compared with the first contact hole 57, the first inter layered insulating film 53 is not filled with the resist mask 56 and left with exposure, though the side wall of the upper portion 58-1 of the second contact hole is clad or covered by the reflown resist. Successively, as illustrated in FIG. 5D, since the first inter layered insulating film 53 is revealed, the first inter layered insulating film 53 is further selectively etched until the first conductive constituent part 52 is revealed.

In this instance, since the etching is conducted in the state that only the side wall 12 of the second inter layered insulating film 54 is clad by the resist mask 56, the first inter layered insulating film 53 is etched in a way that the inner diameter D54 of the contact hole 58 in the second inter layered insulating film 54 which is clad by the resist mask 56 is approximately equal to the inner diameter D53 in the first inter layered insulating film 53. The difference between the inner diameter in the second inter layered insulating film 54 after removing the clad of the resist mask 56 and the inner diameter D53 in the first inter layered insulating film 53 is about two times of the thickness in the horizontal direction of the resist mask 6 which had run and sagged along the side wall by the reflow. Accordingly, when the resist mask 6 is removed from the side wall, there is formed a staircase like forward tapered shape with the thickness of the resist mask 6 by means of the inner diameter D54 of the contact hole 8 in the second inter layered insulating film 4 and the inner diameter D3 in the first inter layered insulating film 3.

Successively, as illustrated in FIG. 5E, the resist mask 56 is removed by the known method. And then, a first wiring layer 59 and a second wiring layer 60 are formed by the known method.

In this case, the first wiring layer 59 lies with the spread on the revealed surface of the second conductive constituent part 55, and along the side wall of the first contact hole 57. Specifically, because the inner diameter of the first inter layered insulating film 53 is smaller than the inner diameter of the second inter layered insulating film 54, a step is formed on the side wall of the first wiring layer 59. On the other hand, the second wiring layer 60 lies with the spread on the revealed surface of the first conductive constituent part 52, and along the side wall of the second contact hole 58.

As the result, there are formed a substrate provided with the contact hole 57 with the depth d51 without being subjected to damages in the second conductive constituent part 55, and the contact hole 58 provided with the thickness of the first inter layered insulating film 53, in addition to the depth d52-1 reaching the first conductive constituent part 52 which is etched appropriately.

By means of forming an unfilled transformed organic mask inside the upper etching structure through reflow in dissolving while filling the side wall of the first etching structure and at least the bottom thereof, it becomes possible to certainly prevent that the bottom of the shallower first etching structure is subjected to damage by over etching, in case of forming the shallower first etching structure and the deeper second etching structure while using the common organic mask.

EMBODIMENT 3

Embodiment 3 will be explained below. The embodiment 3 corresponds to the typical example that conducts the second, the fourth and the sixth aspects of the present invention. FIGS. 6A to 6F illustrate longitudinal cross sectional views showing a series of processes forming a plurality of holes with different depth through one time process of the lithography with regard to the embodiment 3 of the present invention.

As illustrated in FIG. 6A, a first conductive constituent part 72 is selectively formed on a substrate 71. The substrate 71 can be formed with an insulating substrate. The insulating substrate may be, for example, a transparent substrate such as glasses for the use of the liquid crystal display device, and insulating films such as amorphous silicon, silicon dioxide films, silicon nitride films, silicon dioxide films and silicon nitride films for the use of semiconductor integrated circuits. In addition the first conductive constituent part 72 can be formed with a conductive film. As the conductive film, there can be formed with a semiconductor film, a metallic film, an alloy film and metallic silicide film, and for example, in case of a single layer there can be formed with, Chromium, Molybdenum or alloy of them, in case of lamination layers, there can be formed with Chromium•Aluminum or Aluminum•Chromium, and in case of three layers, there can be formed with Molybdenum-Aluminum-Molybdenum.

The film thickness constituting the first conductive constituent part 72 can be determined arbitrarily, not limited specifically, and for example, can be 1 μm or so.

The first conductive constituent part 72 effects a role as a gate electrode, for example, but it is not limited to the role.

Then, a first inter layered insulating film 73 is formed on the substrate 71 and the first conductive constituent part 72.

The first inter layered insulating film 73 can be constituted of the known material. In addition the film thickness of the first inter layered insulating film 73 is arbitrarily determined so as to be enough thicker than that of the first conductive constituent part 72, and is not necessarily limited specifically.

Thereafter, a second conductive constituent part 75 is selectively formed on the first inter layered insulating film 73. In this case, as illustrated in the figure, the location in the horizontal direction of the second conductive constituent part 75 is different from that of the first conductive constituent part 72. The second conductive constituent part 75 may be constituted of conductive films with a single layered structure or multi layered structures, but the layered structure is not necessarily limited.

For example, as illustrated in FIG. 6A, the second conductive constituent part 75 may be constituted of a lower layered conductive film 75-1 and an upper layered conductive film 75-2. In case of two layered structures, for example, the lower layered conductive film 75-1 can be constituted of relatively small material in the electric resistance rate, and the upper layered conductive film 75-2 can be constituted of relatively small material in the etching rate.

To do so, it is possible to reduce the electric resistance of the second electrode, that is, the second conductive constituent part 75, and furthermore, it is possible to suppress damages of the second conductive constituent part 75 by over etching in a first etching process described later.

As the conductive film which constitutes the second conductive constituent part 75, there can be constituted of a semiconductor film, a metallic film, an alloy film and metallic silicide film, and for example, there can be formed with aluminum•copper alloy.

The film thickness constituting the second conductive constituent part 75 can be determined arbitrarily, not limited specifically, and for example, can be 1 μm or so.

In case of two layered structures, for example, each thickness of the lower layered conductive film 75-1 and the upper layered conductive film 75-2 can be determined arbitrarily taking account of respective roles, for example, 0.5 μm or so, respectively. The second conductive constituent part 75 effects, for example, as the roles which are a source electrode or a drain electrode except the gate electrode or an ohmic contact except the electrode, or a wiring. However the roles are not limited to those.

Further, a second inter layered insulating film 74 is formed on the first inter layered insulating film 73 and the second conductive constituent part 75. The second inter layered insulating film 74 can be constituted of the known material. In addition the film thickness of the second inter layered insulating film 74 is arbitrarily determined so as to be enough thicker than that of the second conductive constituent part 75, and is not necessarily limited specifically.

Thereafter, the resist film constituent of organic film is coated on the second inter layered insulating film 74, and then the known processes of exposing and then developing of the resist film are conducted so that a resist mask 76 is formed on the second inter layered insulating film 74. In the case, the, resist mask 76 is provided with a first opening portion 76-1 and a second opening portion 76-2. The first opening portion 76-1 is located at the upper area of the second conductive constituent part 75, and the second opening portion 76-2 is located at the upper area of the first conductive constituent part 72. As illustrated in FIG. 6A, the dimension D71 of the first opening portion 76-1 in the horizontal direction is smaller than the dimension D72 of the second opening portion 76-2 in the horizontal direction.

A staircase like forward tapered shape is formed through half exposing the opening portion 76-2 and ashing thereafter. The thickness D77 in the vicinity of the opening portion 76-2 is thin compared with the ordinary thickness D78 of the resist mask 76.

As illustrated in FIG. 6B, the first etching process is conducted using the resist mask 76 in which an isotropic etching is conducted by selecting only the second inter layered insulating film 74, so that a first contact hole 77 and an upper portion 78-1 of a second contact hole is formed inside the second inter layered insulating film 74. As illustrated in FIG. 6B, the first contact hole 77 is formed in accordance with the first opening portion 76-1 of the resist mask 76, passes through only the second inter layered insulating film 74, and reaches the surface of the second conductive constituent part 75. Namely, a portion of the surface of the second conductive constituent part 75 is revealed through the first contact hole 77. And the depth d71 corresponds to the value obtained by subtracting the thickness of the second conductive constituent part 75 from the thickness of the second inter layered insulating film 74. Further, the dimension of the first contact hole 77 in the horizontal direction is defined by the dimension D71 of the first opening portion 76-1 of the resist mask 76 in the horizontal direction.

On the other hand, the upper portion 78-1 of the second contact hole is formed in accordance with the second opening portion 76-2 of the resist mask 76 and passes through only the second inter layered insulating film 74, and reaches the interface of the second inter layered insulating film 74 and the first inter layered insulating film 73. And, the depth d72-1 of the upper portion 78-1 of the second contact hole corresponds to the depth of the second inter layered insulating film 74. Namely, the depth d72-1 of the upper portion 78-1 of the second contact hole is deeper by the depth of the second conductive constituent part 75 than the depth d71 of the first contact hole 77(d72-1>d71). Further, the dimension of the upper portion 78-1 of the second contact hole in the horizontal direction is defined by the dimension D72 of the second opening portion 76-2 of the resist mask 76 in the horizontal direction.

As stated previously, the first contact hole 77 and the upper portion 78-1 of the second contact hole are formed using the same resist mask 76 in the same etching process. Here, when the etching depth reaches the depth d71, a part of the surface of the second conductive constituent part 75 is revealed, so that the first contact hole 77 is formed.

Next, as illustrated in FIG. 6C, after etching the second inter layered insulating film 74, the surrounding of the second opening portion 76-2 is exposed again and ashing is conducted, so that the resist mask 76 in the surrounding of the second opening portion 76-2 is flaked.

In this case, as illustrated in FIG. 6D, when the resist mask 76 is in contact with organic solvent in the state of cladding, the resist mask 76 is dissolved and then it reflows. When the resist mask 76 reflows, the re-flown resist mask fills not only the bottom of the contact hole 77, but also whole the contact hole 77, because of the diameter of the opening portion small.

On the contrary, because the opening portion of the upper portion 78-1 of the second contact hole has the large diameter D72 and the volume of the second contact hole also is large compared with the first contact hole 77, the first inter layered insulating film 73 is not filled with the resist mask 76 and left with exposure, though the side wall of the upper portion 78-1 of the second contact hole is clad or covered by the re-flown resist.

Successively, as illustrated in FIG. 6E, since the first inter layered insulating film 73 is revealed, the first inter layered insulating film 73 is further selectively etched until the first conductive constituent part 72 is revealed.

In this instance, the first inter layered insulating film 73 is etched in a way that the inner diameter D74 of the contact hole 78 in the second inter layered insulating film 74 which is clad by the resist mask 76 is approximately equal to the inner diameter D73 in the first inter layered insulating film 73.

Successively, as illustrated in FIG. 6F, the resist mask 76 is removed by the known method. And then, a first wiring layer 79 and a second wiring layer 80 are formed by the known method.

In this case, the first wiring layer 79 lies with the spread on the revealed surface of the second conductive constituent part 75, and along the side wall of the first contact hole 77. Specifically, because the inner diameter of the first inter layered insulating film 73 is smaller than the inner diameter of the second inter layered insulating film 74, a step is formed on the side wall of the first wiring layer 79. On the other hand, the second wiring layer 80 lies with the spread on the revealed surface of the first conductive constituent part 72, and along the side wall of the second contact hole 78.

As the result, there are formed a substrate provided with the contact hole 77 with the depth d71 without being subjected to damages in the second conductive constituent part 75, and the contact hole 78 provided with the thickness of the first inter layered insulating film 73, in addition to the depth d72-1 reaching the first conductive constituent part 72 which is etched appropriately.

By means of forming an unfilled transformed organic mask inside the upper etching structure through reflow in dissolving while filling the side wall of the first etching structure and at least the bottom thereof, it becomes possible to certainly prevent that the bottom of the shallower first etching structure is subjected to damage by over etching, in case of forming the shallower first etching structure and the deeper second etching structure while using the common organic mask.

Availability on Industry

The method for etching and the method for forming contact holes using the same, with regard to the present invention can be applied to the method for manufacturing every semiconductor device provided with a plurality of etching structures with each different depth. In the case, there is no limitation in the kinds of semiconductor devices. As the examples there can be cited a variety of display device, such as a liquid crystal display device and EL display devices, and an active matrix substrate, such as a thin film transistor substrate as the substrate for the display devices.

It should be understood, of course, that the foregoing disclosure relates only to preferred embodiments of the invention, and that it is intended to cover all changes and modifications of the example of the invention herein chosen for the purpose of the disclosure which does not constitute departures from the spirit and scope of the invention set forth in the appended claims.

BRIEF DESCRIPTION OF THE DRAWINGS

FIG. 4B is a partially longitudinal cross section view illustrating one process in a chain of processes forming a plurality of holes with different depth by one time lithography process with regard to embodiment 1 of the present invention.

FIG. 4C is a partially longitudinal cross section view illustrating one process in a chain of processes forming a plurality of holes with different depth by one time lithography process with regard to embodiment 1 of the present invention.

Figure 1A:
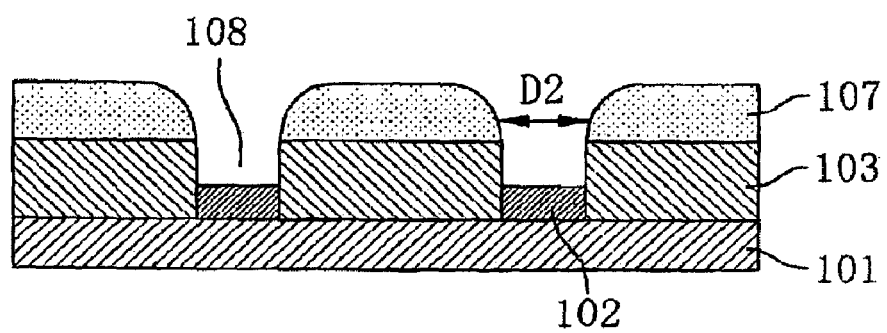
FIG. 1A is a partially longitudinal cross section view illustrating one process in a chain of processes forming a minute contact hole using thermal reflow of a resist film constituted of an organic film with regard to the first prior art.
Figure 1B:
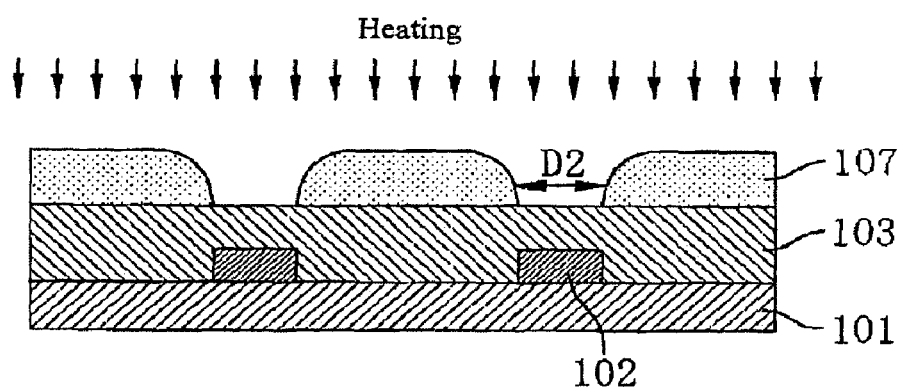
FIG. 1B is a partially longitudinal cross section view illustrating one process in a chain of processes forming a minute contact hole using thermal reflow of a resist film constituted of an organic film with regard to the fist prior art.
Figure 1C:
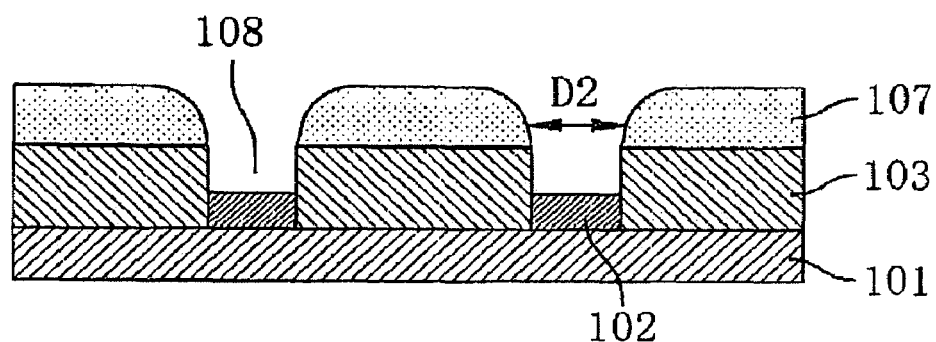
FIG. 1C is a partially longitudinal cross section view illustrating one process in a chain of processes forming a minute contact hole using thermal reflow of a resist film constituted of an organic film with regard to the fist prior art.
Figure 1D:
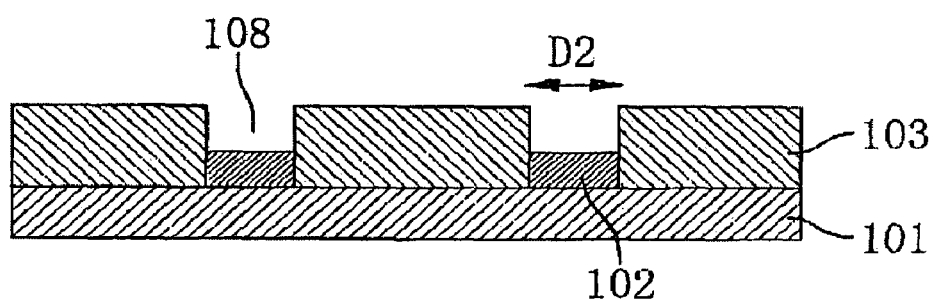
FIG. 1D is a partially longitudinal cross section view illustrating one process in a chain of processes forming a minute contact hole using thermal reflow of a resist film constituted of an organic film with regard to the fist prior art.
Figure 2A:
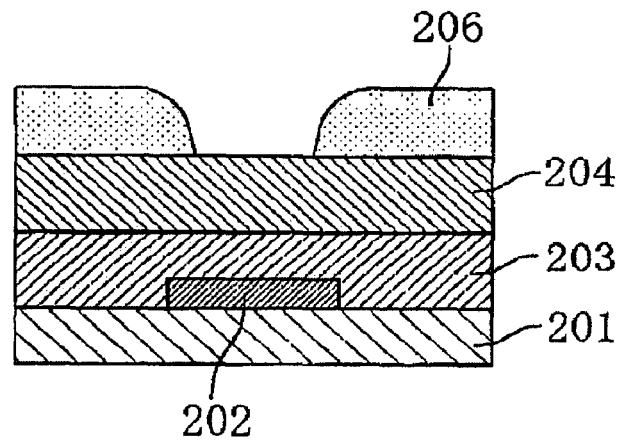
FIG. 2A is a partially longitudinal cross section view illustrating one process in a chain of processes forming a contact hole using without change a resist mask formed by known lithography process with regard to the second prior art.
Figure 2B:
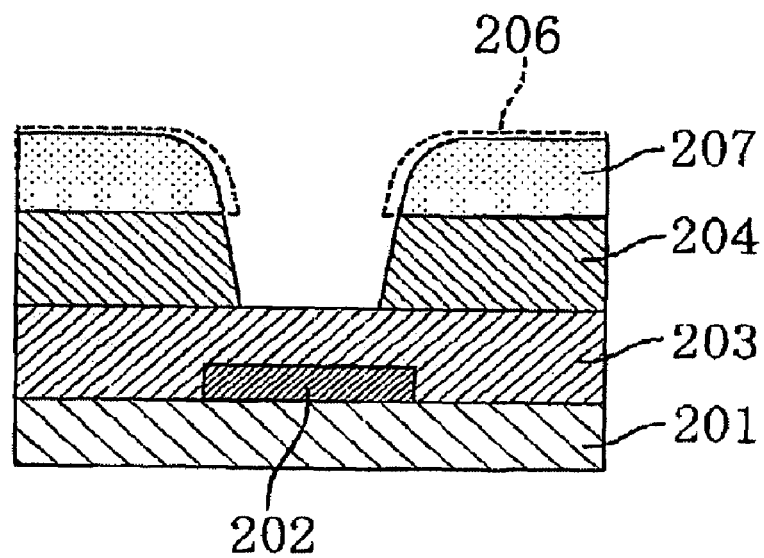
FIG. 2B is a partially longitudinal cross section view illustrating one process in a chain of processes forming a contact hole using without change a resist mask formed by known lithography process with regard to the second prior art.
Figure 2C:
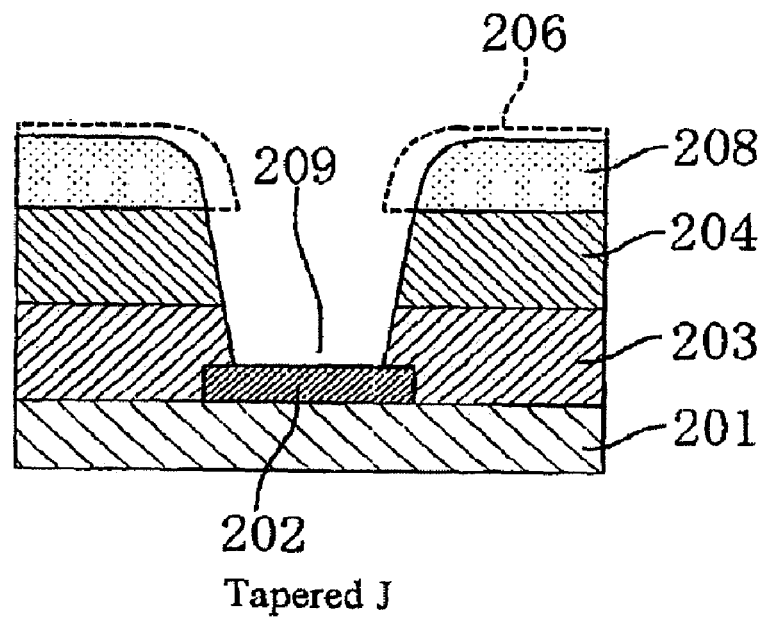
FIG. 2C is a partially longitudinal cross section view illustrating one process in a chain of processes forming a contact hole using without change a resist mask formed by known lithography process with regard to the second prior art.
Figure 3A:
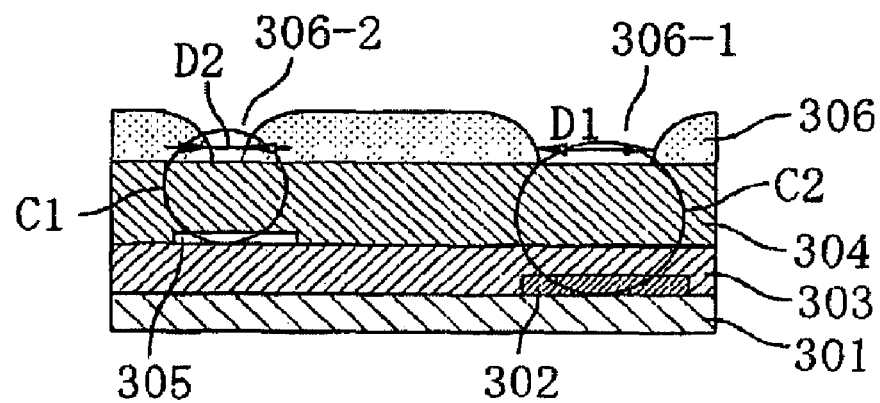
FIG. 3A is a partially longitudinal cross section view illustrating one process in a chain of processes forming a plurality of contact holes with different depth by one time lithography process with regard to the third prior art.
Figure 3B:
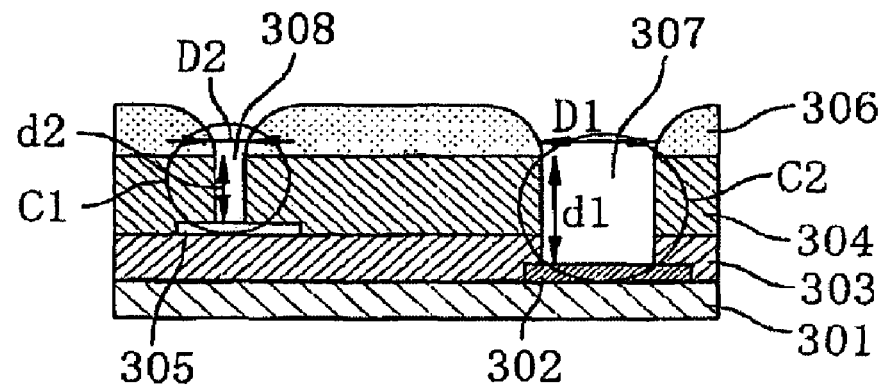
FIG. 3B is a partially longitudinal cross section view illustrating one process in a chain of processes forming a plurality of contact holes with different depth by one time lithography process with regard to the third prior art.
Figure 3C:
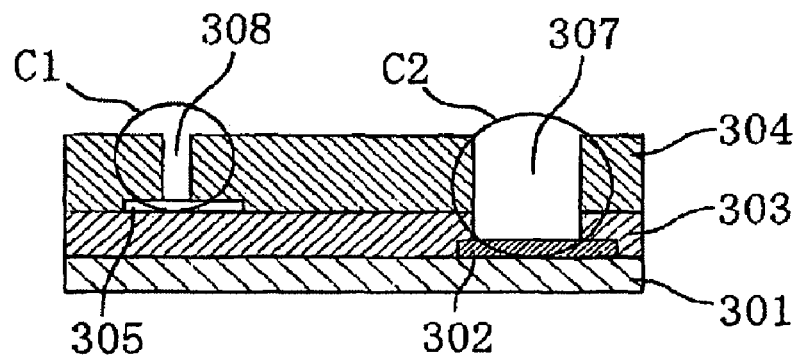
FIG. 3C is a partially longitudinal cross section view illustrating one process in a chain of processes forming a plurality of contact holes with different depth by one time lithography process with regard to the third prior art.
Figure 3D:
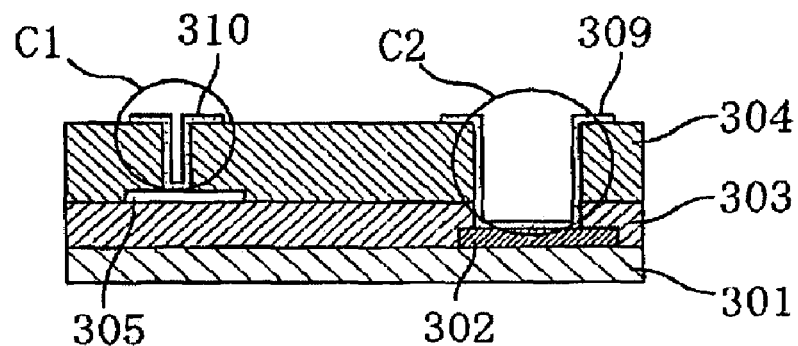
FIG. 3D is a partially longitudinal cross section view illustrating one process in a chain of processes forming a plurality of contact holes with different depth by one time lithography process with regard to the third prior art.
Figure 4A:
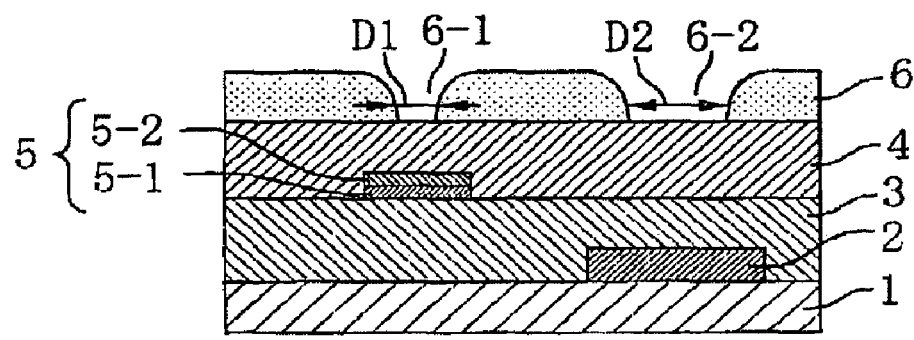
FIG. 4A is a partially longitudinal cross section view illustrating one process in a chain of processes forming a plurality of holes with different depth by one time lithography process with regard to embodiment 1 of the present invention.
Figure 4D:
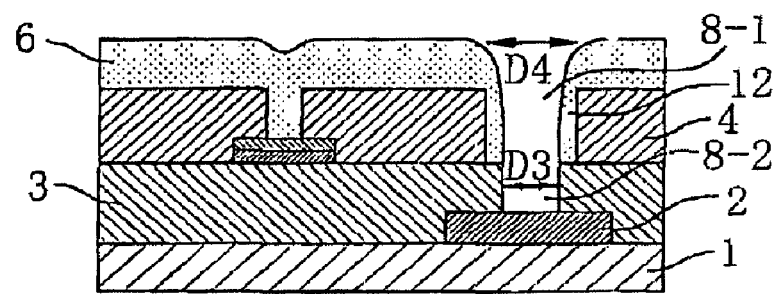
FIG. 4D is a partially longitudinal cross section view illustrating one process in a chain of processes forming a plurality of holes with different depth by one time lithography process with regard to embodiment 1 of the present invention.
Figure 4E:
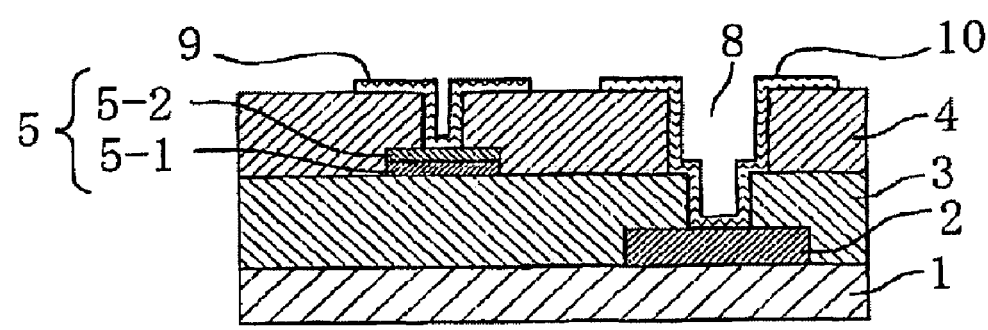
FIG. 4E is a partially longitudinal cross section view illustrating one process in a chain of processes forming a plurality of holes with different depth by one time lithography process with regard to embodiment 1 of the present invention.
Figure 5A:
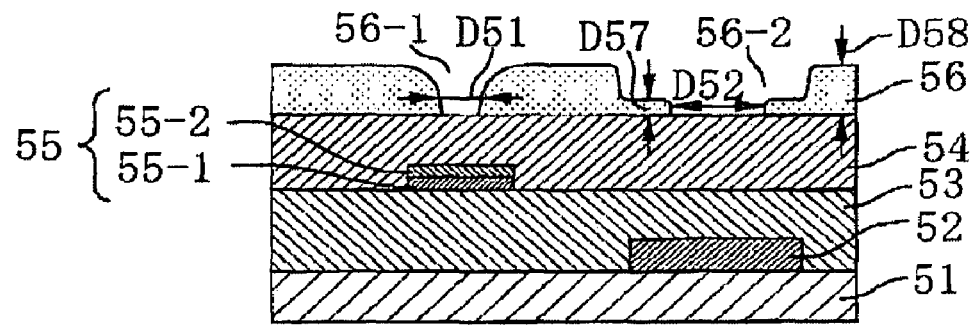
FIG. 5A is a partially longitudinal cross section view illustrating one process in a chain of processes forming a plurality of holes with different depth by one time lithography process with regard to embodiment 2 of the present invention.
Figure 5B:
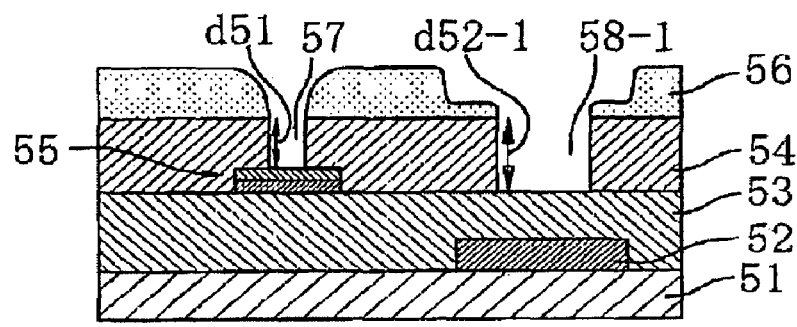
FIG. 5B is a partially longitudinal cross section view illustrating one process in a chain of processes forming a plurality of holes with different depth by one time lithography process with regard to embodiment 2 of the present invention.
Figure 5C:
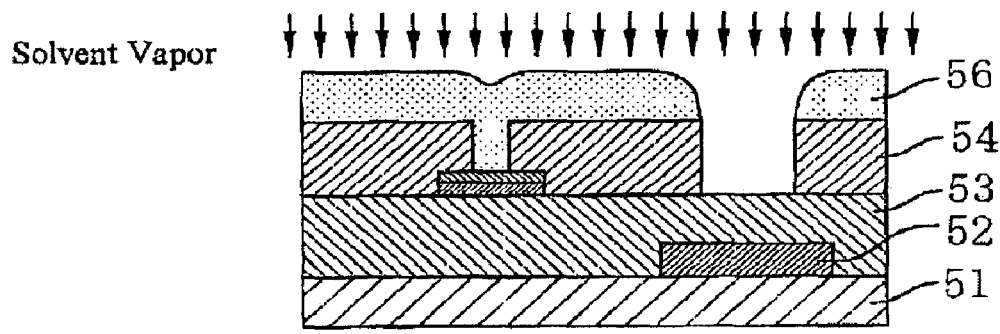
FIG. 5C is a partially longitudinal cross section view illustrating one process in a chain of processes forming a plurality of holes with different depth by one time lithography process with regard to embodiment 2 of the present invention.
Figure 5D:
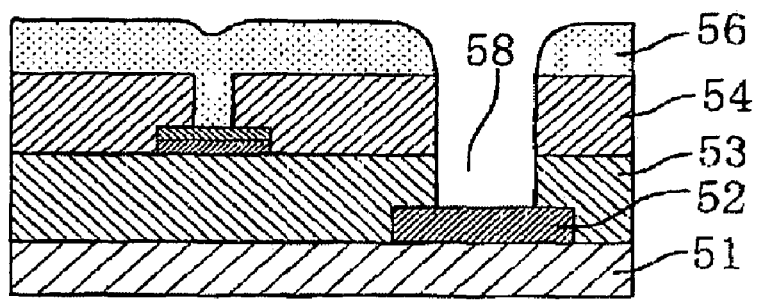
FIG. 5D is a partially longitudinal cross section view illustrating one process in a chain of processes forming a plurality of holes with different depth by one time lithography process with regard to embodiment 2 of the present invention.
Figure 5E:
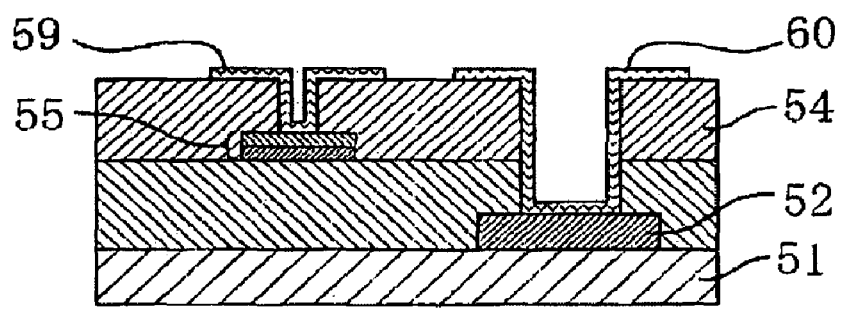
FIG. 5E is a partially longitudinal cross section view illustrating one process in a chain of processes forming a plurality of holes with different depth by one time lithography process with regard to embodiment 2 of the present invention.
Figure 6A:
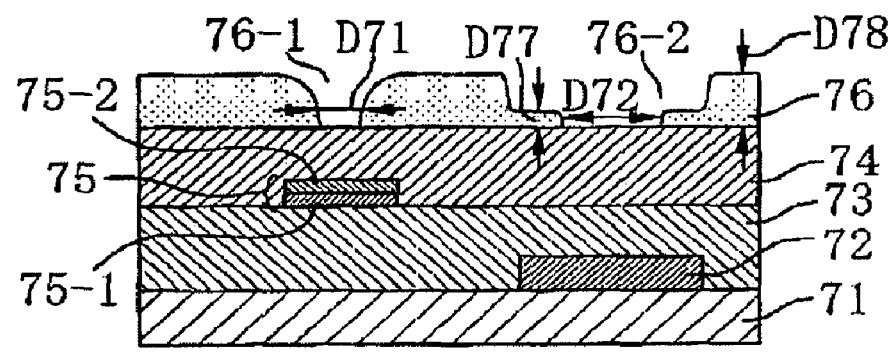
FIG. 6A is a partially longitudinal cross section view illustrating one process in a chain of processes forming a plurality of holes with different depth by one time lithography process with regard to embodiment 3 of the present invention.
Figure 6B:
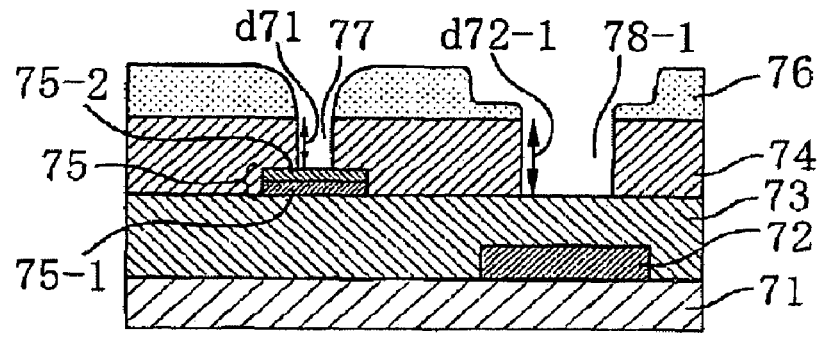
FIG. 6B is a partially longitudinal cross section view illustrating one process in a chain of processes forming a plurality of holes with different depth by one time lithography process with regard to embodiment 3 of the present invention.
Figure 6C:
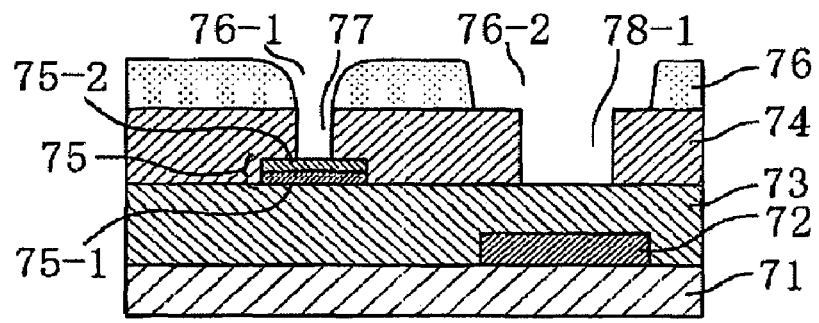
FIG. 6C is a partially longitudinal cross section view illustrating one process in a chain of processes forming a plurality of holes with different depth by one time lithography process with regard to embodiment 3 of the present invention.
Figure 6D:
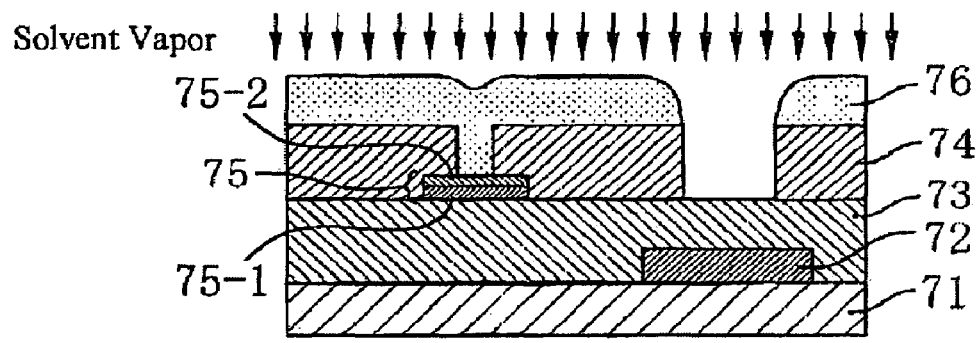
FIG. 6D is a partially longitudinal cross section view illustrating one process in a chain of processes forming a plurality of holes with different depth by one time lithography process with regard to embodiment 3 of the present invention.
Figure 6E:
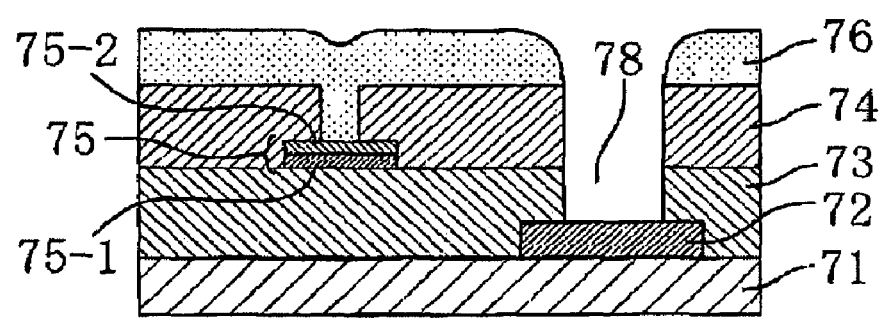
FIG. 6E is a partially longitudinal cross section view illustrating one process in a chain of processes forming a plurality of holes with different depth by one time lithography process with regard to embodiment 3 of the present invention.
Figure 6F:
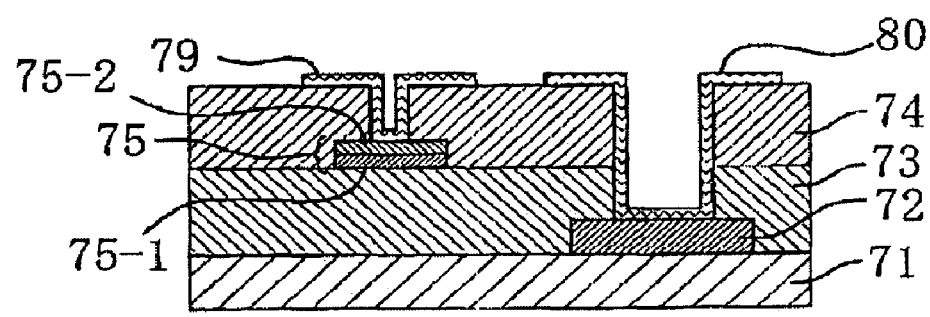
FIG. 6F is a partially longitudinal cross section view illustrating one process in a chain of processes forming a plurality of holes with different depth by one time lithography process with regard to embodiment 3 of the present invention.

The invention claimed is:

1. A method for etching at least including:
    a process for forming an organic mask having a first opening portion in which a first etching structure is formed and a second opening portion in which a second etching structure provided with a upper etching structure is formed, by patterning an organic film which includes either one of an organic film and a film with the addition of organic solvent and is located on a constituent part to be etched, and
    a process for forming a transformed organic mask by dissolving the organic mask in contact with organic solvent and reflowing,
    wherein a part of the organic mask runs and sags along a side wall of the first etching structure in a way that the organic mask fills the side wall and at least a bottom of the first etching structure while leaving a portion unfilled in the upper etching structure.

2. A method for etching according to claim 1, wherein the part of the organic mask runs and sags in a way that the organic mask reaches a vicinity area of the upper end of the upper etching structure, leaving an inside of the upper etching structure unfilled.

3. A method for etching according to claim 1, wherein the method, after forming the transformed organic mask in accordance with the first etching structure and the upper etching structure in the second etching structure, further includes a process for selectively etching the constituent part to be etched to a depth of a second final target level which is deeper than a first final target level without any etching damages to a bottom of the first etching structure while using the transformed organic mask, thereby forming a lower etching structure provided just below the upper etching structure in the second etching structure,
    the first etching structure having the first final target level of depth, and
    the upper etching structure and the lower etching structure defining the second etching structure having the second final target level of depth.

4. A method for etching according to claim 1, wherein the method, after forming the transformed organic mask in accordance with the first etching structure and the upper etching structure in the second etching structure, further includes a process for selectively etching the constituent part to be etched to a depth of a second final target level which is deeper than a first final target level without any etching damages to a bottom of the first etching structure while using the transformed organic mask, thereby forming a lower etching structure provided just below the upper etching structure in the second etching structure and with a horizontal dimension smaller than that of the upper etching structure,
    the first etching structure having the first final target level of depth, and
    the upper etching structure and lower etching structure defining the second etching structure having the second final target level of depth and with forward tapered in a staircase pattern.

5. A method for
etching according to claim 1, wherein the etching forms a contact hole.

6. A method for etching according to claim 1, wherein the organic film is formed with at least thickness of the film being formed so as to have a plurality of stages.

7. A method for
etching according to claim 6, wherein the etching forms a contact hole.

8. A method for etching according to claim 1, wherein the organic film formed with a plurality of stages in the film thickness has a film thickness area in a vicinity of at least one of the first opening portion and the second opening portion, thinner than other areas.

9. A method for etching according to claim 8, wherein the etching forms a contact hole.

10. A method for etching according to claim 1, wherein the process for forming the organic mask further forms a first opening portion and a second opening portion having a diameter larger than that of the first opening portion.

11. A method for etching according to claim 10, wherein the etching forms a contact hole.

12. A method for etching according to claim 1, wherein the transformed organic mask fills one of the first opening portion or the second opening portion, and leaves the other unfilled.

13. A method for etching according to claim 12, wherein the etching forms a contact hole.

14. A method for etching according to claim 1, wherein the method includes a process for etching the constituent part to be etched using the organic mask which becomes the transformed organic mask successively, and a process for selectively etching the constituent part to be etched just beneath of the first opening portion and the second opening portion.

15. A method for etching according to claim 14, wherein the selectively etching is an optionality of the first opening portion and the second opening portion.

16. A method for etching according to claim 15, wherein the etching forms a contact hole.

17. A method for etching according to claim 14, wherein the selectively etching is based on a difference of etching amount in the first opening portion and the second opening portion.

18. A method for etching according to claim 17, wherein the etching forms a contact hole.

19. A method for etching according to claim 14, wherein the selectively etching is based on a difference of etching depth in the first opening portion and the second opening portion.

20. A method for etching according to claim 19, wherein the etching forms a contact hole.

21. A method for etching according to claim 14, wherein the selectively etching is based on a difference of etching damage in the first opening portion and the second opening portion.

22. A method for etching according to 21, wherein the etching forms a contact hole.

23. A method for etching according to claim 14, wherein the first opening portion and the second opening portion are different in planar dimensions.

24. A method for etching according to claim 23, wherein the etching forms a contact hole.

25. A method for etching according to claim 14, wherein the etching forms a contact hole.

26. A method for etching according to claim 3, wherein the etching forms a contact hole.

27. A method for etching which includes: a process for forming an organic mask having a first opening portion and a second opening portion by patterning an organic film which includes either one of an organic film and a film with the addition of organic solvent and is located on a constituent part to be etched, a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask, a process for forming a transformed organic mask by dissolving the organic mask in contact with organic solvent, reflowing and at least filling a bottom of the first etching structure with a part of reflown organic mask while leaving a upper etching structure unfilled, and a process for forming the first etching structure with the first final target level of depth and a second etching structure with a second final target level of depth, provided with the upper etching structure and a lower etching structure, by forming the lower etching structure lying just below the upper etching structure while selectively etching the constituent part to be etched to a depth of the second final target level which is deeper than that of the first final target level without any etching damages to the bottom of the first etching structure using the transformed organic mask.

28. A method for etching according to claim 27, wherein the method includes a process for forming a transformed organic mask through reflow in dissolving in which the reflow in dissolving fills at least the bottom of the first etching structure while leaving the upper etching structure unfilled.

29. A method for etching which includes:

a process for forming an organic mask having a first opening portion and a second opening portion having a dimension larger than that of the first opening portion by patterning an organic film which includes either one of an organic film and a film with the addition of organic solvent and is located on a constituent part to be etched, a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask, a process for forming a transformed organic mask in a way that by dissolving the organic mask in contact with organic solvent and reflowing, a part of the organic mask is running and sagging along a side wall of the first etching structure and along a side wall of a upper etching structure of the second etching structure, so that the re-flown organic mask fills both of the side walls and at least a bottom of the first etching structure while leaving a bottom of the upper etching structure unfilled, and a process for forming the first etching structure with the first final target level of depth and a second etching structure with a second final target level of depth and with forward tapered in a staircase pattern, the second etching structure providing with the upper etching structure and a lower etching structure lying just below the upper etching structure and having a horizontal dimension smaller than that of the upper etching structure in the second etching structure, while selectively etching the constituent part to be etched to the depth of the second final target level which is deeper than that of the first final target level, without any etching damages to the bottom of the first etching structure using the transformed organic mask.

30. A method for etching according to claim 29, wherein the horizontal dimension of the lower etching structure in the second etching structure is smaller than that of the upper etching structure, by the quantity corresponding to approximately two times of the thickness formed in the horizontal direction of the transformed organic mask after reflow in dissolving runs and sags along the side wall of the upper etching structure.

31. A method for etching which includes:
a process for forming an organic mask having a first opening portion and a second opening portion by patterning an organic film which includes either one of an organic film and a film with the addition of organic solvent and is located on a constituent part to be etched,
a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask,
a process for forming a transformed organic mask in a way that by dissolving the organic mask in contact with organic solvent and reflowing, a part of the organic mask is running and sagging along a side wall of the first etching structure, so that the re-flown organic mask fills the side wall of the first etching structure and at least a bottom thereof while leaving inside of the upper etching structure unfilled, and
a process for forming the first etching structure with the first final target level of depth and a second etching structure with a second final target level of depth, the second etching structure providing with the upper etching structure and a lower etching structure lying just below the upper etching structure in the second etching structure, by selectively etching the constituent part to be etched to the depth of the second final target level which is deeper than that of the first final target level, without any etching damages to the bottom of the first etching structure using the transformed organic mask.

32. A method for etching according to claim 31, wherein the method includes a process for forming an unfilled transformed organic mask inside the upper etching structure through reflow in dissolving while filling the side wall of the first etching structure and at least the bottom thereof.

33. A method for etching which includes:
a process for forming an organic mask having a first opening portion and a second opening portion, and having a thickness in the vicinity of the second opening portion thinner than other portions by patterning an organic film which includes either one of an organic film and a film with the addition of organic solvent and is located on a constituent part to be etched,
a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask,
a process for forming a transformed organic mask in a way that by dissolving the organic mask in contact with organic solvent and reflowing, a part of the organic mask is running and sagging along a side wall of the first etching structure, so that the re-flown organic mask fills the side wall of the first etching structure and at least a bottom thereof while leaving inside of the upper etching structure unfilled, and
a process for forming the first etching structure with the first final target level of depth and a second etching structure with a second final target level of depth, the second etching structure providing with the upper etching structure and a lower etching structure lying just below the upper etching structure in the second etching structure, by selectively etching the constituent part to be etched to the depth of the second final target level which is deeper than that of the first final target level, without any etching damages to the bottom of the first etching structure using the transformed organic mask.

34. A method for etching according to claim 33, wherein the method includes a process for forming an unfilled transformed organic mask inside the upper etching structure through reflow in dissolving while filling the side wall of the first etching structure and at least the bottom thereof.

35. A method for etching which includes:
a process for forming an organic mask having a first opening portion and a second opening portion, and having a thickness in the vicinity of the second opening portion thinner than other portions by patterning an organic film which includes either one of an organic film and a film with the addition of organic solvent and is located on a constituent part to be etched,
a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask,
a process for removing only a portion with thinner film thickness in the vicinity of the second opening portion, a process for forming a transformed organic mask in a way that by dissolving the organic mask in contact with organic solvent and reflowing, a part of the organic mask is running and sagging along a side wall of only the first etching structure, so that the reflown organic mask fills the side wall of the first etching structure and at least a bottom thereof while leaving inside of the upper etching structure unfilled, though the re-flown organic mask reaches a vicinity area of the upper end of the upper etching structure, and
a process for forming the first etching structure with the first final target level of depth and a second etching structure with a second final target level of depth, the second etching structure providing with the upper etching structure and a lower etching structure lying just below the upper etching structure in the second etching structure, by selectively etching the constituent part to be etched to the depth of the second final target level which is deeper than that of the first final target level, without any etching damages to the bottom of the first etching structure using the transformed organic mask.

36. A method for etching according to claim 35, wherein the method includes a process for forming an unfilled transformed organic mask inside the upper etching structure through reflow in dissolving while filling the side wall of the first etching structure and at least the bottom thereof.

37. A method for forming a contact hole which includes:

a process for forming an organic mask having a first opening portion and a second opening portion by patterning an organic film which includes either one of an organic film and a film with the addition of organic solvent and is located on a constituent part to be etched, a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask, a process for forming a transformed organic mask by dissolving the organic mask in contact with organic solvent, reflowing and at least filling a bottom of the first etching structure with a part of re-flown organic mask while leaving a upper etching structure unfilled, and a process for forming the first etching structure with the first final target level of depth and a second etching structure with a second final target level of depth, provided with the upper etching structure and a lower etching structure, by forming the lower etching structure lying just below the upper etching structure while selectively etching the constituent part to be etched to a depth of the second final target level which is deeper than that of the first final target level without any etching damages to the bottom of the first etching structure using the transformed organic mask.

38. A method for forming a contact hole according to claim 37, wherein the method includes a process that reflow in dissolving fills at least the bottom of the first etching structure while leaving the upper etching structure unfilled.

39. A method for forming a contact hole which includes:

a process for forming an organic mask having a first opening portion and a second opening portion having a dimension larger than that of the first opening portion by patterning an organic film which includes either one of an organic film and a film with the addition of organic solvent and is located on a constituent part to be etched, a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask, a process for forming a transformed organic mask in a way that by dissolving the organic mask in contact with organic solvent and reflowing, a part of the organic mask is running and sagging along a side wall of the first etching structure and along a side wall of a upper etching structure of the second etching structure, so that the reflown organic mask fills both of the side walls and at least a bottom of the first etching structure while leaving a bottom of the upper etching structure unfilled, and a process for forming the first etching structure with the first final target level of depth and a second etching structure with a second final target level of depth and with forward tapered in a staircase pattern, the second etching structure providing with the upper etching structure and a lower etching structure lying just below the upper etching structure and having a horizontal dimension smaller than that of the upper etching structure in the second etching structure, while selectively etching the constituent part to be etched to the depth of the second final target level which is deeper than that of the first final target level, without any etching damages to the bottom of the first etching structure using the transformed organic mask.

40. A method for forming a contact hole according to claim 39, wherein the horizontal dimension of the lower etching structure in the second etching structure is smaller than that of the upper etching structure, by the quantity corresponding to approximately two times of the thickness formed in the horizontal direction of the transformed organic mask after reflow in dissolving runs and sags along the side wall of the upper etching structure.

41. A method for forming a contact hole which includes:

a process for forming an organic mask having a first opening portion and a second opening portion by patterning an organic film which includes either one of an organic film and a film with the addition of organic solvent and is located on a constituent part to be etched, a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask, a process for forming a transformed organic mask in a way that by dissolving the organic mask in contact with organic solvent and reflowing, a part of the organic mask is running and sagging along a side wall of the first etching structure, so that the re-flown organic mask fills the side wall of the first etching structure and at least a bottom thereof while leaving inside of the upper etching structure unfilled, and a process for forming the first etching structure with the first final target level of depth and a second etching structure with a second final target level of depth, the second etching structure providing with the upper etching structure and a lower etching structure lying just below the upper etching structure in the second etching structure, by selectively etching the constituent part to be etched to the depth of the second final target level which is deeper than that of the first final target level, without any etching damages to the bottom of the first etching structure using the transformed organic mask.

42. A method for forming a contact hole according to claim 41, wherein the method includes a process for forming an unfilled transformed organic mask inside the upper etching structure through reflow in dissolving while filling the side wall of the first etching structure and at least the bottom thereof.

43. A method for forming a contact hole which includes:
a process for forming an organic mask having first opening portion and a second opening portion, and having a thickness in the vicinity of the second opening portion thinner than other portions by patterning an organic film which includes either one of an organic film and a film with the addition of organic solvent and is located on a constituent part to be etched,
a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask,
a process for forming a transformed organic mask in a way that by dissolving the organic mask in contact with organic solvent and reflowing, a part of the organic mask is running and sagging along a side wall of the first etching structure, so that the re-flown organic mask fills the side wall of the first etching structure and at least a bottom thereof while leaving inside of the upper etching structure unfilled, and
a process for forming the first etching structure with the first final target level of depth and a second etching structure with a second final target level of depth, the second etching structure providing with the upper etching structure and a lower etching structure lying just below the upper etching structure in the second etching structure, by selectively etching the constituent part to be etched to the depth of the second final target level which is deeper than that of the first final target level, without any etching damages to the bottom of the first etching structure using the transformed organic mask.

44. A method for forming a contact hole according to claim 43, wherein
the method includes a process for forming an unfilled transformed organic mask inside the upper etching structure through reflow in dissolving while filling the side wall of the first etching structure and at least the bottom thereof.

45. A method for forming a contact hole which includes:
a process for forming an organic mask having a first opening portion and a second opening portion, and having a thickness in the vicinity of the second opening portion thinner than other portions by patterning an organic film which includes either one of an organic film and a film with the addition of organic solvent and is located on a constituent part to be etched,
a process for forming a first etching structure with a first final target level of depth and is located below the first opening portion, and for forming a upper etching structure with a depth equal or similar to the first final target level of depth and is located below the second opening portion, by selectively etching the constituent part to be etched using the organic mask,
a process for removing only a portion with thinner film thickness in the vicinity of the second opening portion,
a process for forming a transformed organic mask in a way that by dissolving the organic mask in contact with organic solvent and reflowing, a part of the organic mask is running and sagging along a side wall of only the first etching structure, so that the re-flown organic mask fills the side wall of the first etching structure and at least a bottom thereof while leaving inside of the upper etching structure unfilled, though the re flown organic mask reaches a vicinity area of the upper end of the upper etching structure, and
a process for forming the first etching structure with the first final target level of depth and a second etching structure with a second final target level of depth, the second etching structure providing with the upper etching structure and a lower etching structure lying just below the upper etching structure in the second etching structure, by selectively etching the constituent part to be etched to the depth of the second final target level which is deeper than that of the first final target level, without any etching damages to the bottom of the first etching structure using the transformed organic mask.

46. A method for forming a contact hole according to claim 45, wherein the method includes a process for forming an unfilled transformed organic mask inside the upper etching structure through reflow in dissolving while filling the side wall of the first etching structure and at least the bottom thereof.

47. A method for etching at least including:
a process for forming an organic mask having a first opening portion in which a first etching structure is formed and a second opening portion in which a second etching structure provided with a upper etching structure is formed, by patterning an organic film which includes either one of an organic film and a film with the addition of organic solvent and is located on a constituent part to be etched, and
a process for forming a transformed organic mask by dissolving the organic mask in contact with organic solvent and reflowing, wherein a part of the organic mask runs and sags along a side wall of the first etching structure and along a side wall of the upper etching structure of the second etching structure in a way that the organic mask fills both of the side wall and at least a bottom of the first etching structure, while leaving a bottom of the upper etching structure unfilled.

48. A method for etching according to claim 47, wherein the etching forms a contact hole.

49. A method for etching at least including:
a process for forming an organic mask having a first opening portion in which a first etching structure is formed and a second opening portion in which a second etching structure provided with a upper etching structure is formed, by patterning an organic film which includes either one of an organic film and a film with the addition of organic solvent and is located on a constituent part to be etched, and
a process for forming a transformed organic mask by dissolving the organic mask in contact with organic solvent and reflowing, wherein a part of the organic mask runs and sags along a side wall of only the first etching structure in a way that the organic mask fills the side wall and at least a bottom of the first etching structure while the organic mask reaches a vicinity area of the upper end of the upper etching structure, leaving inside the upper etching structure unfilled.

50. A method for etching according to claim 49 wherein the etching forms a contact hole.

51. A method for etching at least including:
a process for forming an organic mask having a first opening portion in which a first etching structure is formed and a second opening portion in which a second etching structure provided with a upper etching structure is formed, by patterning an organic film which includes either one of an organic film and a film with the addition of organic solvent and is located on a constituent part to be etched, a process for forming a transformed organic mask by dissolving the organic mask in contact with organic solvent and reflowing, and a process for selectively etching the constituent part to be etched after the forming of the transformed organic mask to a depth of a second final target level which is deeper than a first final target level without any etching damages to a bottom of the first etching structure while using the transformed organic mask, thereby forming a lower etching structure provided just below the upper etching structure in the second etching structure and with a horizontal dimension smaller than that of the upper etching structure, the first etching structure having the first final target level of depth, and the upper etching structure and lower etching structure defining the second etching structure having the second final target level of depth and with forward tapered in a staircase pattern.

52. A method for etching, according to claim 51 wherein the etching forms a contact hole.

* * * * *